US011212930B2

(12) United States Patent
Bristol et al.

(10) Patent No.: US 11,212,930 B2
(45) Date of Patent: Dec. 28, 2021

(54) MEDIA DEVICE INCLUDING DISPLAY AND POWER-DELIVERY MECHANISM WITH INTEGRATED STAND

(71) Applicant: Facebook Technologies, LLC, Menlo Park, CA (US)

(72) Inventors: Peter Wesley Bristol, Seattle, WA (US); Chunli Chen, Seattle, WA (US); Oliver Ross, San Francisco, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 29 days.

(21) Appl. No.: 16/574,998

(22) Filed: Sep. 18, 2019

(65) Prior Publication Data

US 2021/0084782 A1      Mar. 18, 2021

Related U.S. Application Data

(60) Provisional application No. 62/899,920, filed on Sep. 13, 2019.

(51) Int. Cl.
*H05K 5/02*       (2006.01)
*H01R 13/631*     (2006.01)
(Continued)

(52) U.S. Cl.
CPC ......... *H05K 5/0234* (2013.01); *H01R 13/631* (2013.01); *H01R 43/26* (2013.01); *H05K 5/0017* (2013.01); *H05K 5/0247* (2013.01)

(58) Field of Classification Search
CPC .. H01K 5/0234; H01K 5/0017; H01K 5/0247; H01R 13/631; H01R 43/26; H01R 13/41; H01R 13/5202; H01R 13/521
See application file for complete search history.

(56) References Cited

U.S. PATENT DOCUMENTS 5,550,452 A   8/1996   Shirai et al.
5,977,747 A   11/1999  Huang
(Continued)

FOREIGN PATENT DOCUMENTS

EP    2 387 124 A1    11/2011
WO    2018/066840 A1   4/2018

OTHER PUBLICATIONS

International Search Report and Written Opinion received for PCT Application Serial No. PCT/US2020/047371 dated Nov. 12, 2020, 13 pages.

(Continued)

*Primary Examiner* — James Wu
*Assistant Examiner* — Hung Q Dang
(74) *Attorney, Agent, or Firm* — FisherBroyles, LLP

(57) ABSTRACT

A media device may include (i) a display device having a front side including a display surface, (ii) a support housing for supporting the display device in each of a plurality of alternative orientations on an external surface, the support housing extending from a back side of the display device between a mounting surface of the support housing abutting the back side of the display device and a distal end of the support housing, (iii) a coupling member disposed at the mounting surface of the support housing and mounted to the display device, and (iv) a battery power supply disposed within the support housing and electrically coupled to the display device via an electrical path extending through the coupling member. Various other systems, devices, assemblies, and methods are also disclosed.

20 Claims, 14 Drawing Sheets

(51) Int. Cl.
*H01R 43/26* (2006.01)
*H05K 5/00* (2006.01)

(56) References Cited

U.S. PATENT DOCUMENTS

| | | | |
|---|---|---|---|
| 6,091,453 A | 7/2000 | Coan et al. | |
| 6,523,124 B1 | 2/2003 | Lunsford et al. | |
| 6,704,487 B2 | 3/2004 | Parhami et al. | |
| 6,768,637 B1 | 7/2004 | Amemiya | |
| 6,774,603 B2 | 8/2004 | Liao | |
| 7,422,379 B2 | 9/2008 | Agevik et al. | |
| 7,435,141 B2 | 10/2008 | Tan et al. | |
| 7,502,222 B2 | 3/2009 | Cheng et al. | |
| 7,551,225 B2 | 6/2009 | Overstreet | |
| 7,581,988 B2* | 9/2009 | Boehnlein | A61B 1/00052 439/585 |
| 7,836,623 B2* | 11/2010 | Wang | A47G 1/142 40/747 |
| 7,864,515 B2 | 1/2011 | Numata et al. | |
| 8,897,033 B2* | 11/2014 | Slipy | F16M 13/005 361/807 |
| 9,477,267 B2* | 10/2016 | You | F16M 13/005 |
| 9,874,900 B2 | 1/2018 | Mehandjiysky et al. | |
| 9,960,521 B2 | 5/2018 | Armstrong et al. | |
| D889,677 S | 7/2020 | Harmon | |
| 2003/0013500 A1 | 1/2003 | Dunoff et al. | |
| 2003/0117104 A1 | 6/2003 | Liao | |
| 2003/0221876 A1 | 12/2003 | Doczy et al. | |
| 2004/0191614 A1 | 9/2004 | Iwasaki et al. | |
| 2004/0201871 A1 | 10/2004 | Risheq | |
| 2005/0122424 A1 | 6/2005 | Overstreet | |
| 2008/0045279 A1 | 2/2008 | Ohki | |
| 2008/0068786 A1 | 3/2008 | Cheng et al. | |
| 2008/0253066 A1 | 10/2008 | Tracy et al. | |
| 2009/0187677 A1 | 7/2009 | Hunt et al. | |
| 2010/0053876 A1 | 3/2010 | Widmer et al. | |
| 2010/0315570 A1* | 12/2010 | Mathew | G06F 1/1658 349/58 |
| 2011/0199726 A1 | 8/2011 | Moser | |
| 2012/0106047 A1 | 5/2012 | Chu et al. | |
| 2012/0106068 A1* | 5/2012 | Huang | G06F 1/1632 361/679.41 |
| 2012/0154995 A1 | 6/2012 | Qiao et al. | |
| 2012/0162871 A1 | 6/2012 | Tseng et al. | |
| 2012/0176741 A1 | 7/2012 | Wu et al. | |
| 2012/0314354 A1* | 12/2012 | Rayner | H04M 1/18 361/679.01 |
| 2013/0279106 A1 | 10/2013 | Ergun et al. | |
| 2013/0326583 A1 | 12/2013 | Freihold et al. | |
| 2014/0340829 A1 | 11/2014 | Matsumoto et al. | |
| 2014/0347812 A1 | 11/2014 | Lee et al. | |
| 2016/0070156 A1 | 3/2016 | Alster et al. | |
| 2016/0094691 A1 | 3/2016 | Okuley | |
| 2016/0239048 A1 | 8/2016 | Mehandjiysky et al. | |
| 2017/0265319 A1 | 9/2017 | Hoem et al. | |
| 2019/0235608 A1 | 8/2019 | Shin et al. | |

OTHER PUBLICATIONS

Non-Final Office Action received for U.S. Appl. No. 16/575,005 dated Oct. 2, 2020, 75 pages.
Final Office Action received for U.S. Appl. No. 16/575,005 dated Apr. 14, 2021, 30 pages.
Non-Final Office Action received for U.S. Appl. No. 16/575,005 dated Aug. 3, 2021, 44 pages.

* cited by examiner

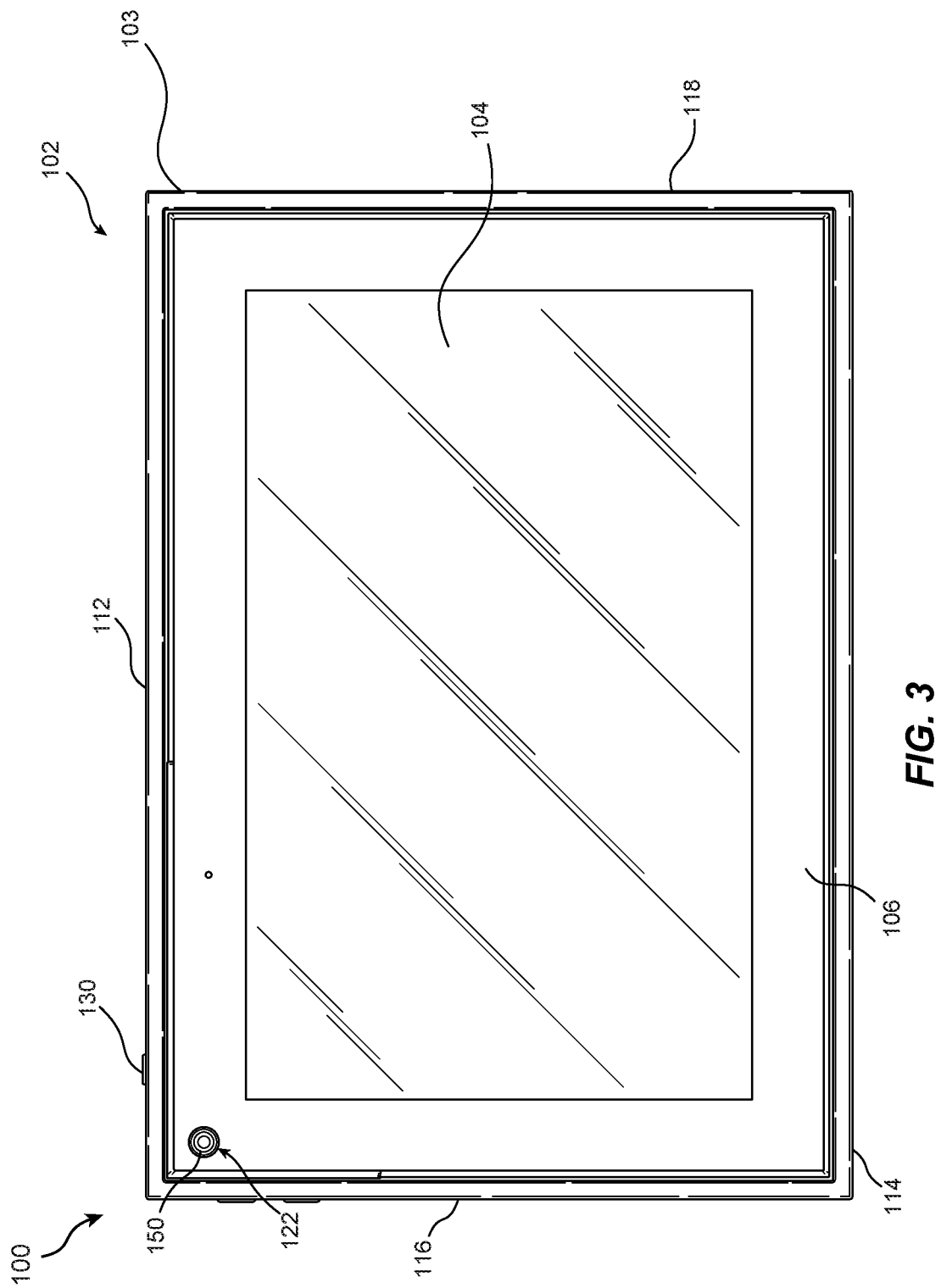

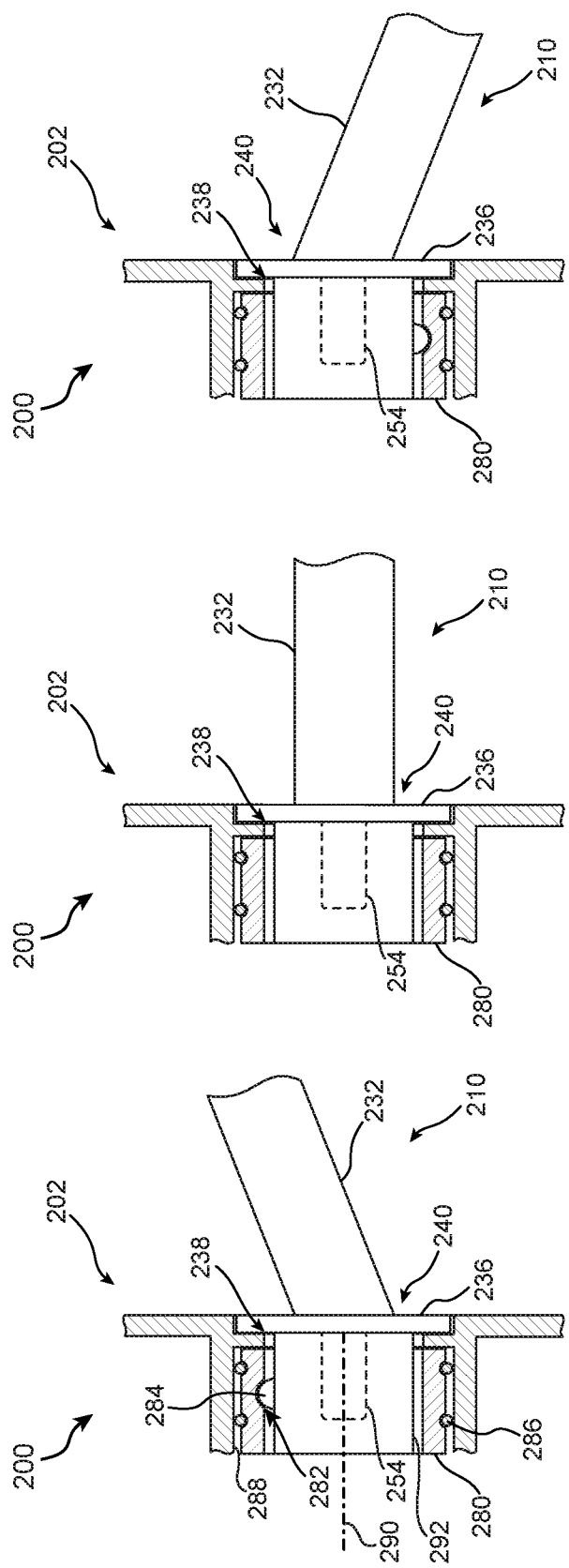

MEDIA DEVICE INCLUDING DISPLAY AND POWER-DELIVERY MECHANISM WITH INTEGRATED STAND

CROSS REFERENCE TO RELATED APPLICATION

This application claims the benefit of U.S. Provisional Application No. 62/899,920, filed 13 Sep. 2019, the disclosure of which is incorporated, in its entirety, by this reference.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 3 is a front view of the media device of FIG. 1 according to some embodiments.

FIG. 9A is a partial cross-sectional side view illustrating an exemplary assembly including a power cable with an integrated stand rotatably mounted to a display device and disposed in a selected orientation according to some embodiments.

FIG. 9B is a partial cross-sectional side view illustrating the assembly of FIG. 9A disposed in another selected orientation according to some embodiments.

FIG. 9C is a partial cross-sectional side view illustrating the assembly of FIG. 9A disposed in another selected orientation according to some embodiments.

Figure 1:
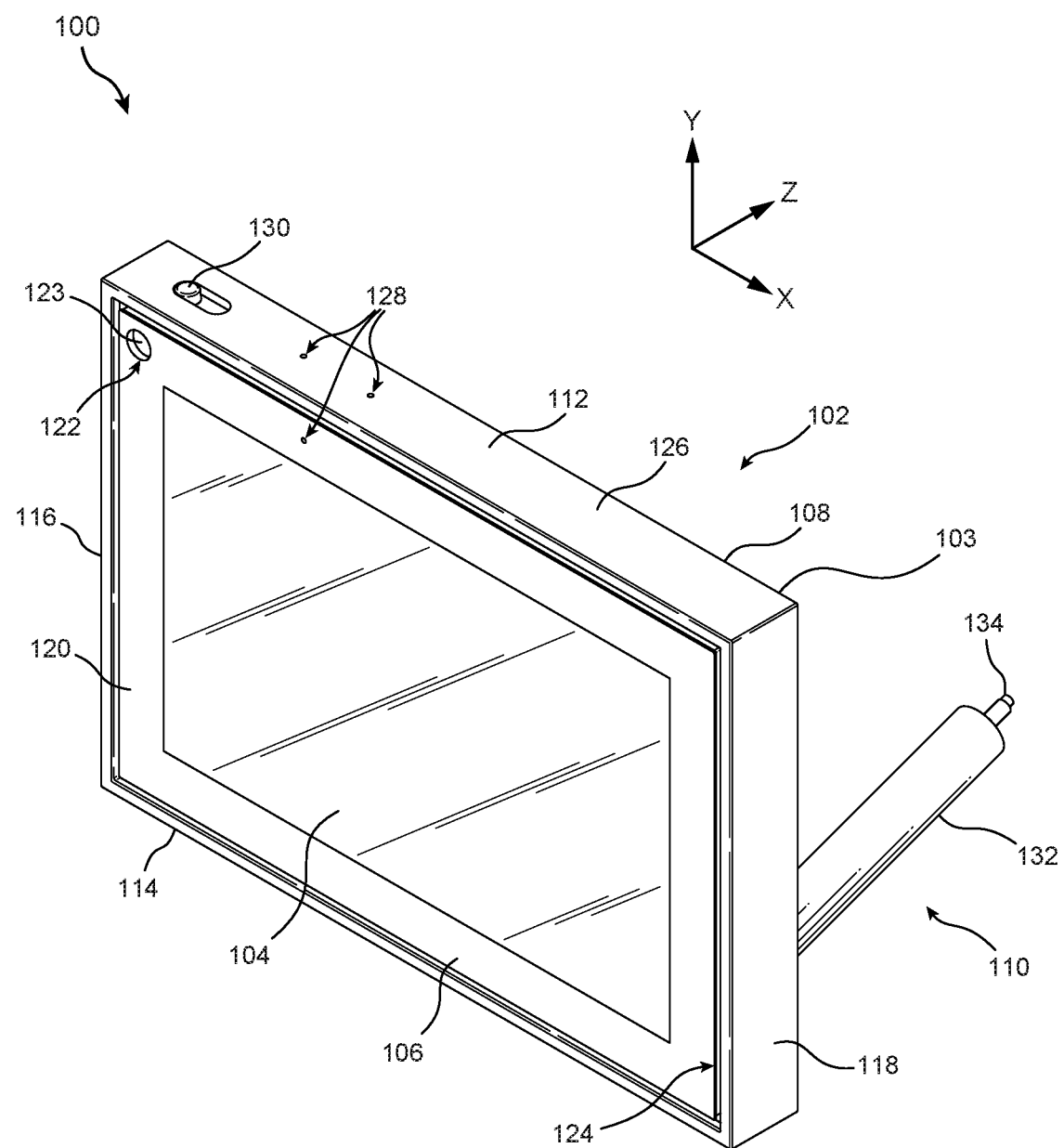
FIG. 1 is a front perspective view of an exemplary media device according to some embodiments of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to media devices and systems that include an assembly having a power-delivery mechanism (e.g., a power supply cable, a battery power supply, etc.) with an integrated stand. Display systems with a variety of interactive features are becoming increasingly commonplace in homes and businesses. People commonly use interactive displays, such as smart displays, that are easily accessible and can provide hands-free access to the online world and rich interactive experiences with other users. However, such interactive devices may have an undesirably large form-factor and/or an unappealing visual profile due to size constraints of high-quality audio and visual components incorporated into the devices. Additionally, the configurations and customizability of interactive display devices may be limited due to display screen viewing angle and camera orientation requirements for providing suitable interactive experiences for users.

As will be explained in greater detail below, embodiments of the present disclosure may provide a compact media device (e.g., a display device, an audio device, a camera device, an interactive smart device, etc.) having a reduced profile and which may include additional customizability via an assembly having power-delivery mechanism, such as a power supply cable and/or a battery power supply, with an integrated stand (i.e., an "integrated assembly"). For example, an exemplary media device may include a device housing having a display surface on a front side and an integrated assembly mounted to a back side. The integrated assembly may include a support member for supporting the device housing in a selected orientation on an external surface (e.g., a tabletop, desktop, countertop, etc.). The integrated assembly may be mounted to the device housing via a coupling member disposed at a proximal end of the support member. A power-delivery mechanism for supplying power to electronic components in the device housing via an electrical connector in the coupling member may be disposed within the support member, in some examples.

The integrated assembly may provide a simplified system that enables users to easily set up and use the media device via a single connection between the integrated assembly and the device housing. In various embodiments, the integrated assembly may function as a stand to support the device housing in a desired and/or optimal orientation for display viewing and/or image capture in both landscape and portrait modes. Additionally, the external profile and bulk of the display system may be reduced by the integrated assembly, which provides both mechanical support and electrical power to operate the media device. In various embodiments, the integrated assembly may be adjustable via a rotational coupling member to provide users with increased customizability. The disclosed media devices and systems may also be readily disassembled by disconnecting the integrated assembly to provide increased portability in comparison to many conventional media devices.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-12, detailed descriptions of interactive media devices and systems including integrated assemblies having power-delivery mechanisms with integrated stands and corresponding methods.

Figure 2:
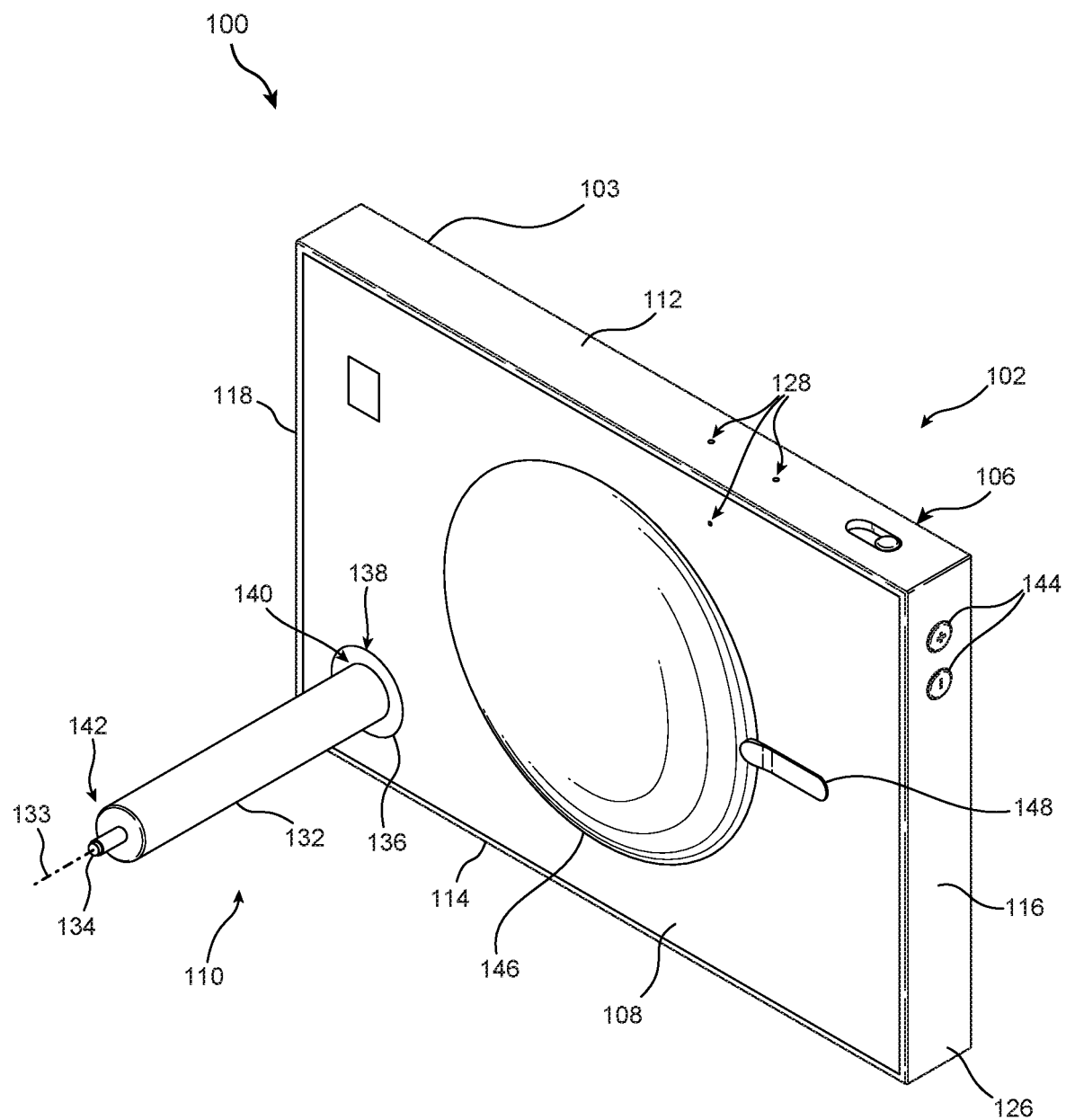
FIG. 2 is a rear perspective view of the media device of FIG. 1 according to some embodiments.

FIGS. 1-3 illustrate an exemplary interactive media device in accordance with various embodiments. As shown in these figures, media device 100 may include a display device 102 that is configured to provide a user with an interactive visual and/or audio experience. Display device 102 may include various features to facilitate user interaction with the device for purposes of communication with other users via an online environment. In some examples, display device 102 may also enable users to access various applications and/or online sites. Display device 102 may include various electronic components disposed within a device housing 103 of display device 102, including at least one physical processor and at least one memory device, and software tools to facilitate user interactions. In at least one example, display device 102 may be connected to an online and/or other networked environment via, for example, a Wi-Fi, cellular, Bluetooth, and/or wired connection. Device housing 103 may have any suitable exterior shape, such as a shape having a rectangular or substantially rectangular profile. In some embodiments, as illustrated in FIGS. 1-3, device housing 103 may include sides having planar or substantially planar surfaces and/or surface portions that intersect at angular, rounded, and/or beveled junctions. For example, device housing 103 may include a front side 106, a back side 108, a top side 112, a bottom side 114, a left side 116, and a right side 118.

Front side 106 of device housing 103 may frame a display surface 104 of display device 102 that provides visual content to a user. According to various embodiments, display device 102 may include an array of pixels for displaying images and/or video viewable via display surface 104. For example, display device 102 may include a liquid crystal display (LCD), light-emitting diode (LED) display, organic light-emitting diode (OLED) display, an inorganic light emitting diode (ILED) display, an active-matrix organic light-emitting diode (AMOLED) display, or any other suitable display technology. In some examples, display device 102 may include an integrated touch sensor at or near display surface 104, such as a mutual capacitance touch sensor, a self-capacitance touch sensor, an inductive touch sensor, or any other suitable touch sensor technology that allows for user touch-based interaction via display surface 104.

In various embodiments, display surface 104 may have a rectangular or substantially rectangular periphery. Display device 102 may be configured to display images and/or video on display surface 104 in any orientation, including, for example, landscape and portrait orientations, as will be described in greater detail below. In some examples, display device 102 may detect its current orientation (e.g., using at least one gyroscope and/or other suitable orientation sensor, or via manual input) and automatically display an image with the top of the image displayed at the top of display surface 104 such that the image appears in a correct orientation for the viewer regardless of the orientation of the display device 102.

In at least one embodiment, front side 106 of device housing 103 may include a frame region 120 peripherally surrounding display surface 104. A camera opening 122 for a camera 150 (see FIG. 3) within device housing 103 may be defined in frame region 120 at or near a corner of frame region 120. For example, camera opening 122 may be disposed near an intersection of top side 112 and left side 116 of device housing 103. Camera opening 122 may allow passage of light to camera 150 to capture images and/or video from a local environment. As shown in FIG. 1, device housing 103 may also include an audio trench 124 disposed between frame region 120 and a surrounding peripheral region 126 of device housing 103. Audio trench 124 may facilitate transmission of sound from speakers concealed within device housing 103 to provide high-quality audio content to a user via front side 106. In various examples, peripheral region 126 may include peripheral side portions of device housing 103, including top side 112, bottom side 114, left side 116, and/or right side 118, and peripheral portions of front side 106 and/or back side 108 of device housing 103. In some examples, at least a portion of peripheral region 126 may include a material that provides a suitable degree of stiction with respect to a variety of surface types to prevent sliding of display device 102 during use. Such a material may also have vibration damping properties to absorb acoustic vibrations generated by the display audio system. For example, peripheral region 126 may include an elastomeric layer (e.g., a polyurethane polymer, such as thermoplastic polyurethane, TPU, and/or any other suitable elastomer) that contacts an external surface (e.g., external surface 152 in FIGS. 4A and 4B) when device housing 103 is positioned on the external surface in various orientations.

In some examples, display device 102 may include one or more microphones within device housing 103 that receive audio from a surrounding environment via one or more corresponding microphone openings 128 defined in, for example, top side 112, front side 106, and/or back side 108. Such microphones may be positioned and configured to pick up sound from various directions in the local environment around display device 102. According to at least one embodiment, display device 102 may also include a privacy switch 130 that is accessible, for example, at top side 112 of device housing 103. Privacy switch 130 may be slidable by a user to select between various privacy modes in which camera 150 and/or microphones are enabled or disabled. In some examples, a camera shutter 123 may be positionable by privacy switch 130 to cover at least a portion of camera opening 122 and block the view of camera 150, as shown in FIG. 1. Additionally, as shown in FIG. 3, camera shutter 123 may be positioned via privacy switch 130 so that it does not overlap camera opening 122, thereby allowing camera 150 to capture images from the local environment when permitted by the user. Camera 150 may be configured to receive light from a field of view and generate pictures and/or video of a portion of the local environment in the field of view. In at least one example, camera 150 may have a wide field of view to allow for image capture of one or more users and/or objects in a variety of locations in the local environment.

According to various embodiments, media device 100 may include an integrated assembly 110 that is coupled to device housing 103 of display device 102 to provide mechanical support and electrical power to electronic components disposed within device housing 103 of display device 102. Integrated assembly 110 may include a coupling member 136 that is mounted to display device 102 at back side 108 of device housing 103. For example, coupling member 136 of integrated assembly 110 may be secured within a mounting socket 138 defined in device housing 103 of display device 102 at back side 108. In some embodiments, coupling member 136 may be mounted at a portion of display device 102 that is generally opposite a position of camera 150 in each of the X-, Y-, and Z-directions shown in FIG. 1. For example, coupling member 136 may be positioned at back side 108 of device housing 103 nearest an intersection of bottom side 114 and right side 118, while camera 150 may be positioned adjacent front side 106 nearest an intersection of top side 112 and left side 116.

Integrated assembly 110 may further include an elongated support member 132 for physically supporting display device 102 in a selected orientation on an external surface, as will be described in greater detail below. Support member 132 may extend from back side 108 of device housing 103 and may include a proximal end 140 adjacent coupling member 136. Support member 132 may be elongated along a support member axis 133 that is oriented at any suitable angle, such as an acute angle between approximately 45° and approximately 90° with respect to display surface 104 and/or back side 108 (e.g., an acute angle between approximately 70° and approximately 85°, such as an acute angle of approximately 80° as illustrated in FIGS. 1-3). Support member 132 may extend from coupling member 136 at proximal end 140 to distal end 142. Support member 132 may have a cylindrical or substantially cylindrical shape surrounding support member axis 133, as shown in FIGS. 1-3, or any other suitable elongated shape, without limitation. Additionally, electrical wiring, such as a portion of electrical cable 134 (e.g., a power cord) of integrated assembly 110, may extend from display device 102 through an interior of support member 132 and electrical cable 134 may protrude from distal end 142. In various embodiments, electrical cable 134 may provide electrical power to electronic components of display device 102 that are disposed within device housing 103.

Display device 102 may also include various other components, such as volume buttons 144 located, for example, on left side 116 (see, e.g., FIG. 2) and/or any other suitable location. Volume buttons 144 may be utilized by a user to adjust the volume of audio produced by display device 102. Display device 102 may include one or more speakers for generating sound that is audible via, for example, audio trench 124. The speakers may include, for example, one or more speakers disposed within device housing 103, such as a woofer, which may be covered by a speaker cover 146 (e.g., a grill, mesh, screen, etc.) protruding from back side 108 as illustrated, and/or a pair of tweeters that emit sound via trench 124. In one example, display device 102 may also include a port cover 148 that, for example, covers a port for connecting one or more cables (e.g., a USB cable, an HDMI cable, etc.).

In various embodiments, distal end 142 of support member 132 may be positioned at a location that is approximately equidistant to bottom side 114 and right side 118 of device housing 103 of display device 102 (see, e.g., FIG. 2). This positioning of distal end 142 may enable support member 132 to support device housing 103 at the same or approximately the same inclination when display device 102 is disposed in a portrait orientation or a landscape orientation. In various embodiments, display device 102 may be positionable with display surface 104 disposed in a landscape orientation when a portion of bottom side 114 of device housing 103 abuts and extends along an external surface. Additionally, display device 102 may be positionable with display surface 104 disposed in a portrait orientation when a portion of right side 118 of device housing 103 abuts and extends along the external surface (see, e.g., FIGS. 4A and 4B).

Figure 4A:
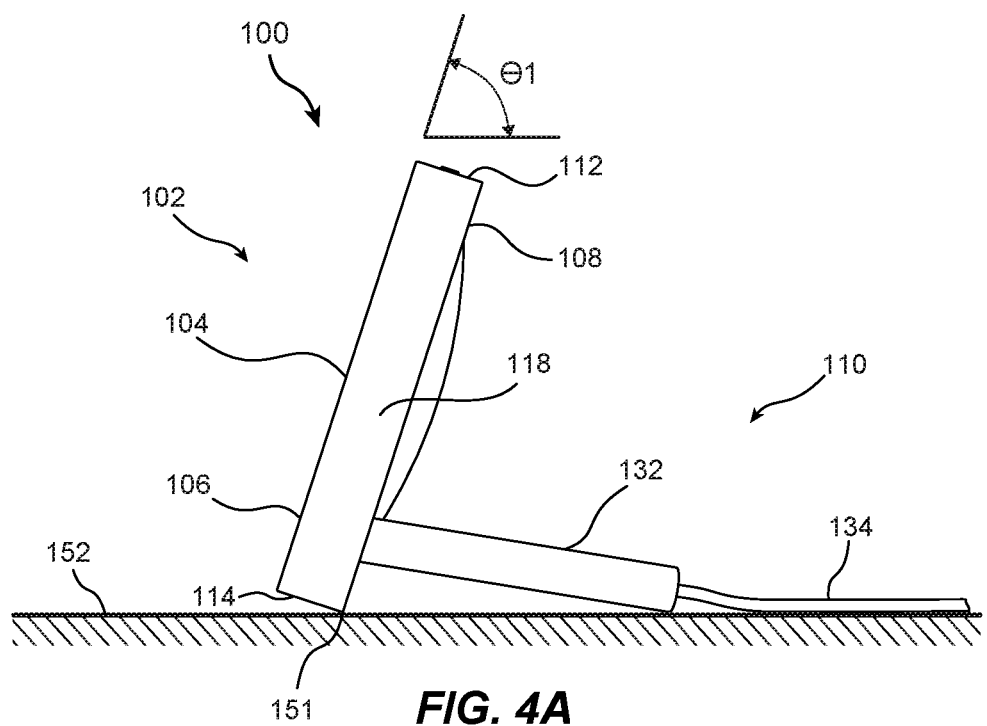
FIG. 4A is a side view illustrating an exemplary media device supported on an external surface in a selected orientation according to some embodiments.
Figure 4B:
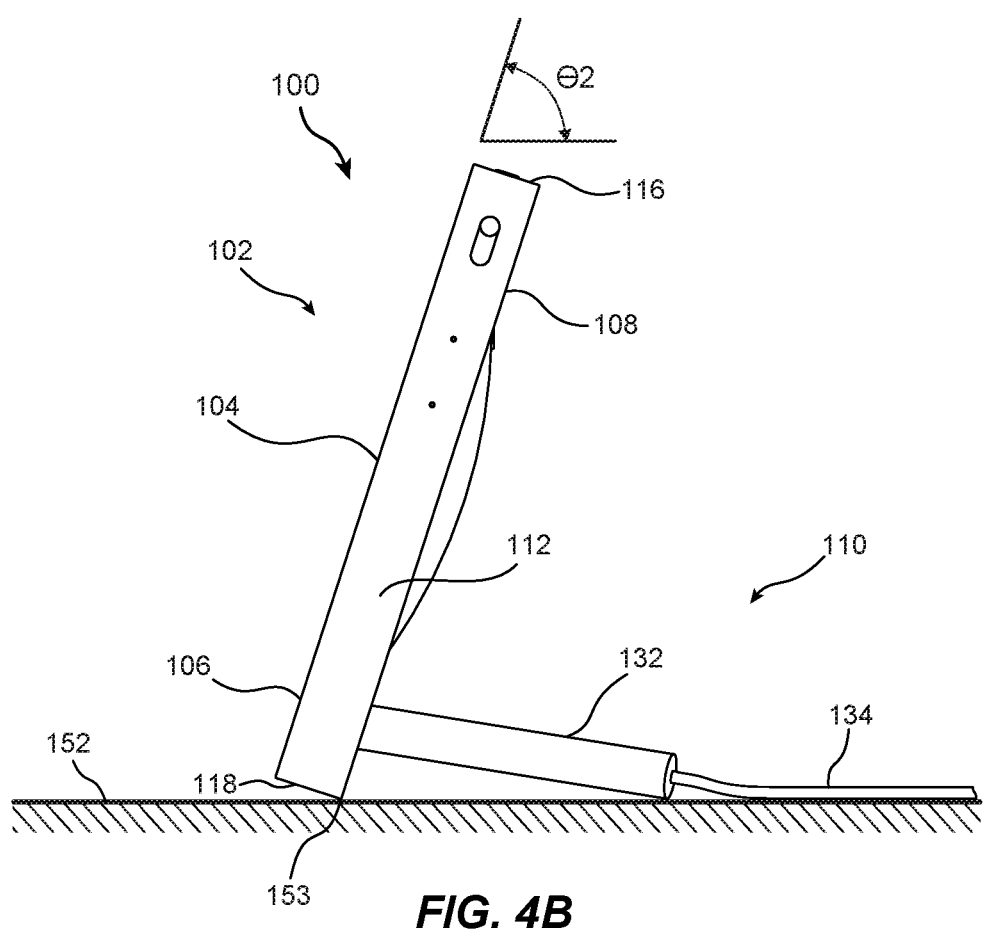
FIG. 4B is a side view illustrating the media device of FIG. 4A supported on the external surface in another selected orientation according to some embodiments.

FIGS. 4A and 4B show the media device 100 illustrated in FIGS. 1-3 with display device 102 disposed in a landscape orientation and a portrait orientation, respectively. In some embodiments, as described above, distal end 142 of support member 132 may be located at the same or approximately the same distance from bottom side 114 and right side 118 of device housing 103. As such, distal end 142 of support member 132 may position display device 102 at the same or approximately the same inclination with respect to an external surface 152 when media device 100 is disposed on external surface 152 with display surface 104 disposed in each of the landscape and portrait orientations.

As shown in FIG. 4A, display device 102 may be positioned in a landscape orientation with a portion of bottom side 114 of device housing 103, such as an edge portion 151 at or near a junction between bottom side 114 and back side 108, abutting and extending along external surface 152, which may be a planar or substantially planar horizontal surface. Additionally, a portion of distal end 142 of support member 132 may abut external surface 152 to support display device 102 in the illustrated position. In this orientation, display surface 104 may likewise be disposed in a landscape orientation and camera 150 may be positioned at an upper-left portion of display device 102 at or near an intersection between left side 116 and top side 112 of device housing 103. (See, e.g., FIGS. 1 and 3). Accordingly, camera 150 may be disposed at a higher position than display surface 104.

In the landscape orientation, as shown in FIG. 4A, display device 102 may be supported by support member 132 of integrated assembly 110 such that display surface 104 at front side 106 is oriented at an inclination angle θ1 with respect to external surface 152 (i.e., with respect to a plane of external surface 152). Inclination angle θi may be any suitable angle, such as an angle between approximately 60° and approximately 85° (e.g., approximately 60°, approximately 65°, approximately 70°, approximately 75°, approximately 80°, approximately) 85°). In some examples, inclination angle θ1 may be an angle that is suitable for a user to view display surface 104 and/or that is suitable for camera 150 to capture images of an external environment. In certain embodiments, inclination angle θ1 may be optimal or substantially optimal for capturing images via camera 150 for utilization by a computer-implemented algorithm that processes the captured images, such as an inclination angle of between approximately 70° and approximately 75° (e.g., an inclination angle of approximately 72°) with respect to external surface 152.

According to at least one embodiment, at least one computer-implemented application executed by one or more physical processors of display device 102 and/or external to display device 102 may identify the presence of one or more users and/or user features (e.g., facial features, hands, etc.) and may locate and/or track their location in the field of view of camera 150. In some examples, the at least one application may zoom, pan, crop, and/or otherwise modify one or more portions of a captured image to digitally enhance a viewing experience for other users receiving such images (e.g., other users communicating remotely with a user of display device 102). In various examples, the at least one application may add image elements to images captured by camera 150 and/or may obscure portions of the captured images to generate enhanced or artificial-reality images and/or to block the appearance of selected objects in the field of view of camera 150. Such applications may be utilized to produce images that are visible to a user on display device 102 and/or to other users in communication with display device 102 via, for example, a connected network.

Additionally or alternatively, the at least one application may be utilized to perform various operations on display device 102. For example display device 102 may be operated in an ON state during which images and/or audio are captured and/or presented by display device 102 when an individual is detected within at least a portion of the field of view of camera 150. Display device 102 may be switched to a standby or OFF state when an individual is not detected within at least the portion of the field of view of camera 150 (e.g., after an individual has been absent from the field of view fora threshold period of time). In some examples, images captured by camera 150 may be utilized for biometric purposes to identify physical features of an individual (e.g., facial features) and limit access to authorized users. Additionally or alternatively, user gestures (e.g., hand, arm, and/or facial gestures) for controlling various operations of display device 102 (e.g., volume control, image adjustment, ON/OFF state, etc.) may be detected via images captured by camera 150. In some examples, the at least one application may use images captured by camera 150 in conjunction with audio captured by microphones of display device 102 to perform various functions, such as one or more operations described above.

As shown in FIG. 4B, display device 102 may also be disposed in a portrait orientation with a portion of right side 118 of device housing 103, such as an edge portion 153 at or near a junction between right side 118 and back side 108, abutting and extending along external surface 152. Additionally, a portion of distal end 142 of support member 132 may abut external surface 152 to support display device 102 in the illustrated position. In this orientation, display surface 104 may likewise be disposed in a portrait orientation and camera 150 may be positioned at an upper-right portion of display device 102 at or near an intersection between left side 116 (which is disposed uppermost in the portrait orientation) and top side 112 of device housing 103 (See, e.g., FIG. 3). Accordingly, camera 150 may be disposed at a higher position than display surface 104.

In the portrait orientation, support member 132 of integrated assembly 110 may support display device 102 with display surface 104 at front side 106 oriented at an inclination angle $\theta 2$ with respect to external surface 152. In some examples, support member 132 may be configured to support display device 102 in both the landscape and portrait orientations such that display surface 104 is inclined at inclination angles $\theta 1$ and $\theta 2$ that are equal or approximately equal, as illustrated in FIGS. 4A and 4B. In these examples, an inclination angle for display surface 104 may be selected, for example, to position display surface 104 and/or camera 150 in an optimal, substantially optimal, or otherwise suitable orientation for enhancing a user's experience and/or for facilitating operations of one or more computer-implemented applications (e.g., image processing applications executed by at least one physical processor of display device 102 and/or external to display device 102 as described above).

In certain examples, support member 132 may be configured to orient display surface 104 at different inclination angles $\theta 1$ and $\theta 2$ with respect to external surface 152 in the portrait orientation and the landscape orientation. As with inclination angle $\theta 1$ discussed above, inclination angle $\theta 2$ may be any suitable angle, such as an angle of between approximately 60° and approximately 85° (e.g., an inclination angle of between approximately 70° and approximately 75°, such as an inclination angle of approximately 72°) with respect to external surface 152. Accordingly, integrated assembly 110 may provide desired and/or ideal positioning of display device 102 in selected portrait and landscape orientations without requiring a bulky housing portion that extends from back side 108 of device housing 103. Additionally or alternatively, as will be described in greater detail below in relation to FIGS. 7A-9C, integrated assembly 110 may be adjustable by a user to allow for a variety of orientations of display device 102 in both landscape and portrait orientations.

Figure 5A:
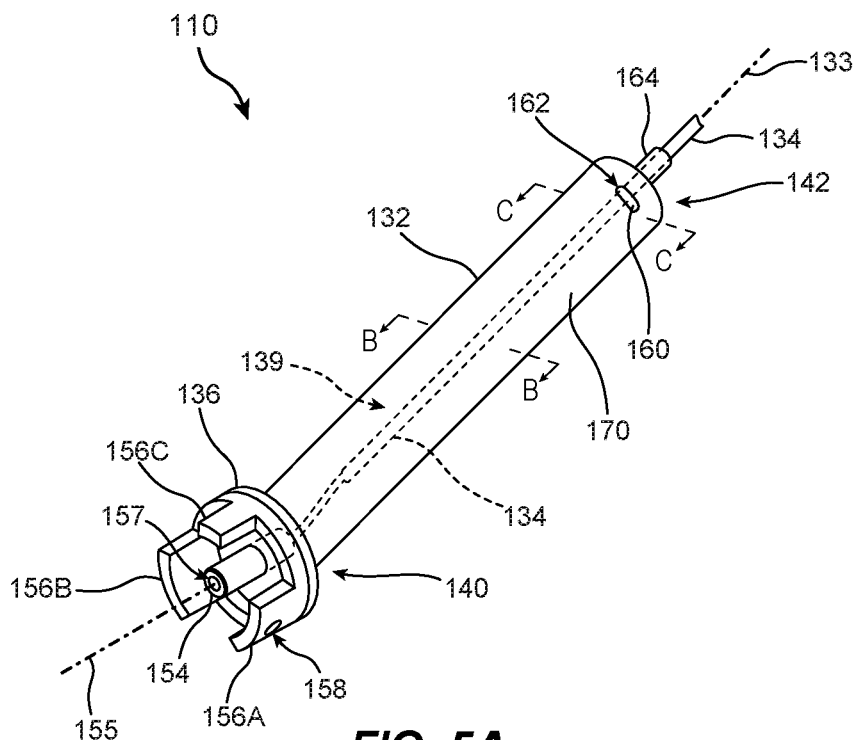
FIG. 5A is a perspective view illustrating an exemplary assembly including a power cable with an integrated stand according to some embodiments.
Figure 5B:
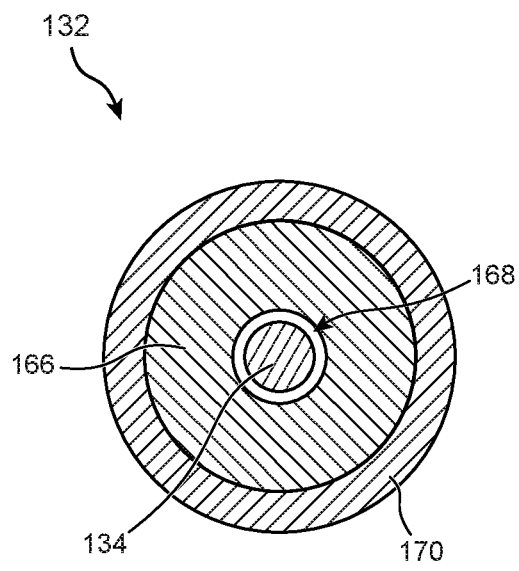
FIG. 5B is a cross-sectional view of a portion the exemplary assembly, taken at line B-B of FIG. 5A, according to some embodiments.
Figure 5C:
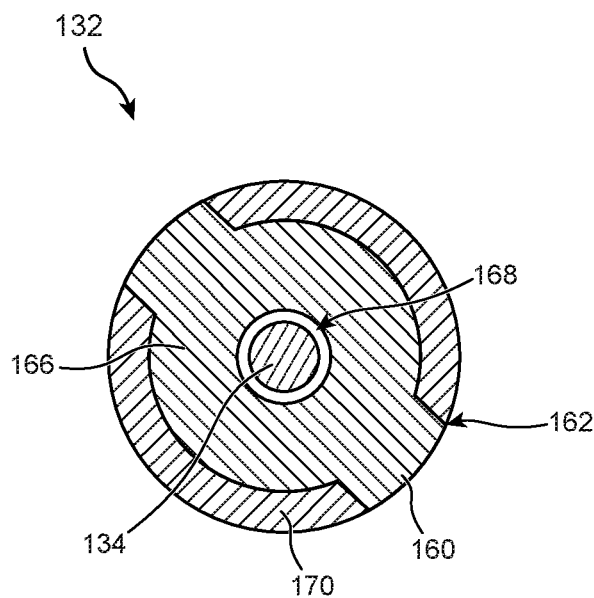
FIG. 5C is a cross-sectional view of another portion of the exemplary assembly, taken at line C-C of FIG. 5A, according to some embodiments.

FIGS. 5A-5C illustrate details of integrated assembly 110 in accordance with various embodiments. FIG. 5A shows integrated assembly 110 detached from device housing 103 of display device 102. According to at least one embodiment, as shown in FIG. 5A, coupling member 136 of integrated assembly 110 may include an electrical connector 154 for electrically coupling a power-delivery mechanism 139, which may include electrical cable 134, to display device 102. Electrical connector 154 may have any suitable shape and configuration for coupling with a corresponding terminal (see, e.g., electrical terminal 178 in FIG. 6) of display device 102. In some examples, as shown in FIG. 5A, electrical connector 154 may have a rounded (e.g., circular) cross-sectional profile centered about a connector axis 155. For example, electrical connector 154 may have a cylindrical or substantially cylindrical and/or frusto-conical periphery, and/or any other suitable periphery, extending along and surrounding connector axis 155 and may include a central opening sized to surround a connection terminal of display device 102. In various examples, electrical connector 154 may be oriented with respect to support member 132 such that connector axis 155 is oriented at an oblique angle respect to support member axis 133 along which support member 132 extends.

Figure 6:
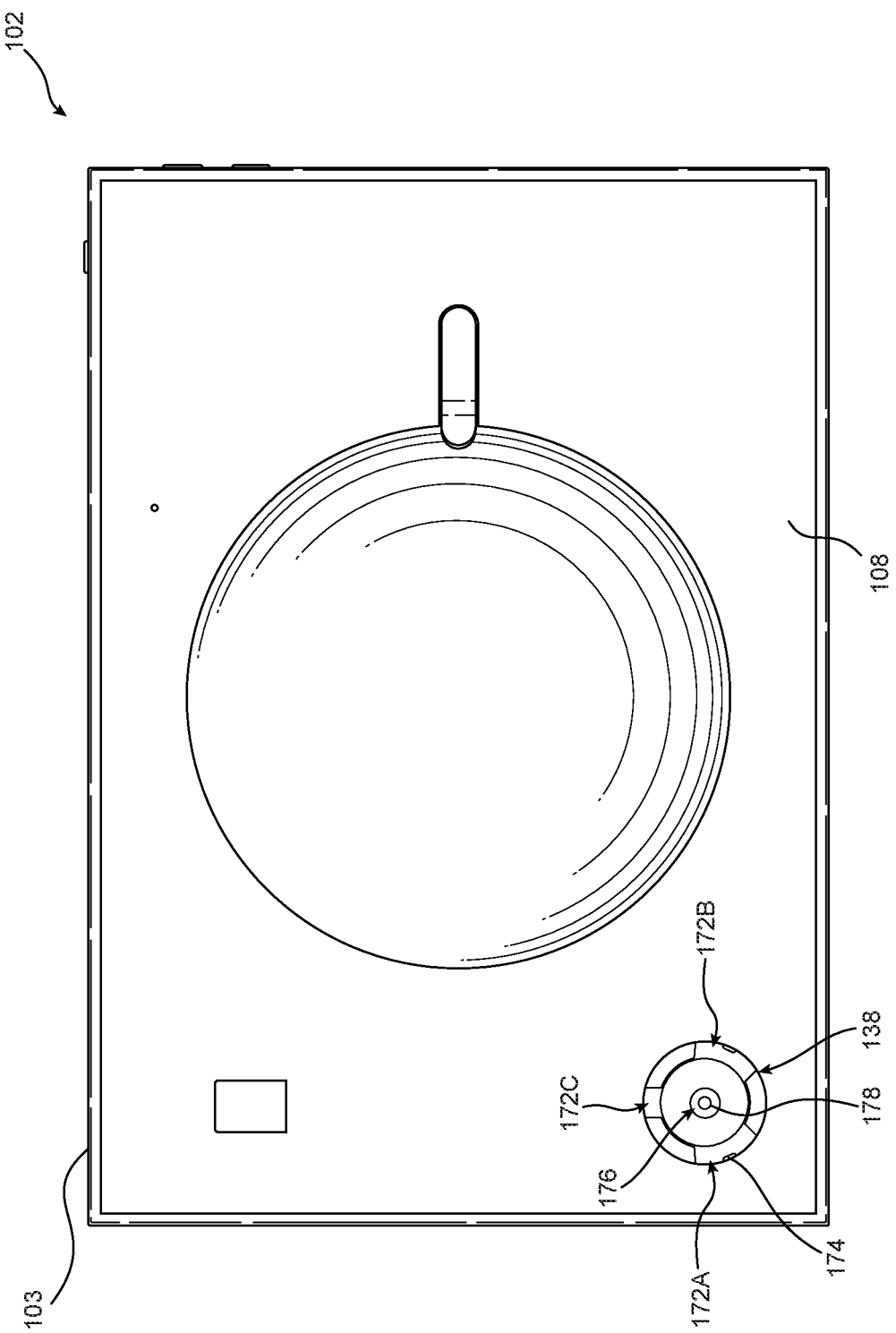
FIG. 6 is a rear view of an exemplary media device according to some embodiments.

FIG. 6 shows a rear view of display device 102 with integrated assembly 110 detached from device housing 103. As illustrated in this figure, mounting socket 138 defined within device housing 103 of display device 102 may extend inward from back side 108. Mounting socket 138 may include a connector socket 176 dimensioned to receive electrical connector 154 when integrated assembly 110 is mounted to display device 102 with coupling member 136 disposed in mounting socket 138. An electrical terminal 178 (e.g., a pin terminal) may be disposed within connector socket 176 and may extend into opening 157 of electrical connector 154 to electrically couple electrical terminal 178 to electrical connector 154. Coupling member 136 and mounting socket 138 may also include elements for securely positioning and fastening integrated assembly 110 to device housing 103. For example, coupling member 136 may include one or more mounting protrusions, such as mounting protrusions 156A-C, that are dimensioned to be received within complementary mounting recesses, such as mounting recesses 172A-C defined in mounting socket 138, so as to guide and hold coupling member 136 within mounting socket 138 in a predetermined orientation. In various examples, coupling member 136 and mounting socket 138 may include one or more fastening features for removably securing coupling member 136 within mounting socket 138. For example, as shown in FIG. 6, mounting socket may include one or more fastening protrusions 174 that are dimensioned to fasten coupling member 136 via one or more corresponding fastening recesses 158 defined in one or more of mounting protrusions 156A-C (see FIG. 5A), thereby removably securing integrated assembly 110 to device housing 103 of display device 102. Fastening protrusions 174 and fastening recesses 158 may be configured to securely mount integrated assembly 110 to display device 102 during display operation and may allow for a user to readily remove integrated assembly from mounting socket 138 to allow for storage and/or transportation of media device 100.

According to some embodiments, as shown in FIG. 5A, integrated assembly 110 may include an electrical cable 134 that is electrically coupled to electrical connector 154 at proximal end 140 of support member 132. As shown, electrical wiring, such as a portion of electrical cable 134 within support member 132, may extend longitudinally within support member 132 from proximal end 140 to distal end 142, with a portion of electrical cable 134 protruding externally from distal end 142. In at least one example, a cable sheath 164 may surround and provide additional support to a portion of electrical cable 134 adjacent distal end 142 of support member 132. Electrical cable 134 may extend from distal end 142 of support member 132 and cable sheath 164 to an outlet plug (not shown) at an opposite end of electrical cable 134. The outlet plug may be configured to be electrically coupled to an electrical outlet to provide power to electronic components of display device 102 via electrical connector 154 connected to electrical terminal 178.

Support member 132 and coupling member 136 may include one or more rigid materials to provide structural support for holding display device 102 in a selected orientation (e.g., a metal, a rigid polymer, a rigid composite, and/or any other suitable rigid material). In various embodiments, as shown in the cross-sectional views of FIGS. 5B and 5C, support member 132 may include a rigid support element 166 that is coupled and/or integrally formed with coupling member 136 in a specified orientation. Rigid support element 166 may define an inner channel 168 that extends longitudinally between proximal end 140 and distal end 142 of support member 132. As shown, electrical wiring, such as electrical cable 134, may extend within inner channel 168 through rigid support element 166. According to various embodiments, support member 132 may also include a frictional cover 170 formed of a resilient material that surrounds at least a portion of rigid support element 166. Frictional cover 170 may include any suitable material that provides sufficient stiction to securely support display device 102 while preventing undesired movement of device housing 103 on various external surface types during use. For example, frictional cover 170 may include an elastomeric material (e.g., a polyurethane polymer, such as TPU, and/or any other suitable elastomer). Frictional cover 170 may be secured to rigid support element 166 in any suitable manner. For example, frictional cover 170 may be bonded, fastened, and/or frictionally engaged with an exterior of rigid support element 166. In some embodiments, frictional cover 170 may be a preformed molded sheath that is slidably positioned over rigid support element 166. In this example, frictional cover 170 may be secured to rigid support element 166 via one or more fastening elements. For example, frictional cover 170 may be positioned over rigid support element 166 so that one or more coupling protrusions 160 protruding radially from rigid support element 166 are disposed within complementary coupling openings 162 defined in frictional cover 170 to prevent movement of frictional cover 170 with respect to rigid support element 166.

Figure 7A:
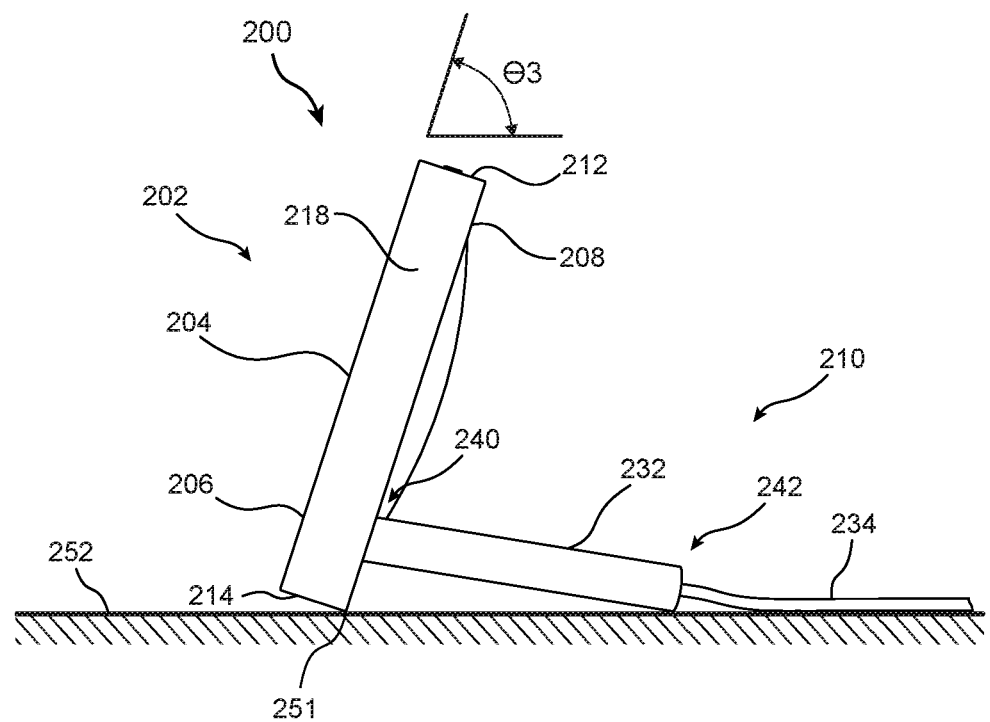
FIG. 7A is a side view illustrating an exemplary media device supported on an external surface in a selected orientation according to some embodiments.
Figure 7B:
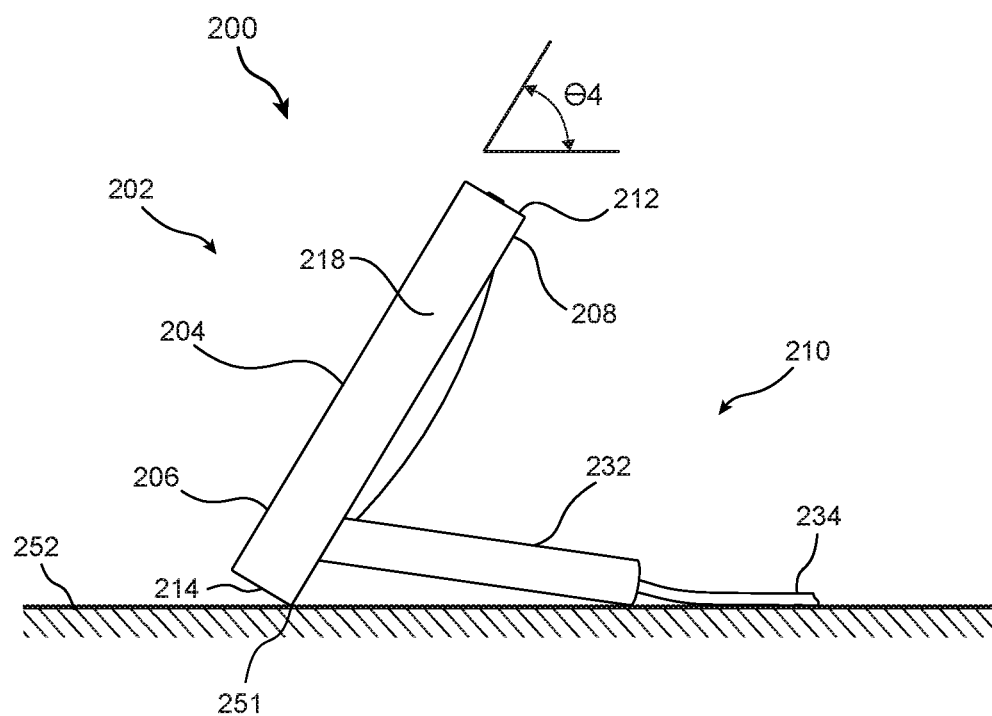
FIG. 7B is a side view illustrating the media device of FIG. 7A supported on the external surface in another selected orientation according to some embodiments.

FIGS. 7A and 7B illustrate a media device 200 having an adjustable integrated assembly 210 that allows for positioning of a display device 202 in multiple inclined orientations in accordance with various embodiments. Display device 202 may include a device housing 203 having a shape that is the same or similar to device housing 103 shown in FIGS. 1-6. As shown, device housing 203 of display device 202 may have a top side 212, a bottom side 214, a left side 216 (see FIGS. 8A and 8B), a right side 218, a front side 206, and the back side 208. Front side 206 may include a display surface 204 and back side 208 may be rotatably coupled to an integrated assembly 210, as will be described in greater detail below. Integrated assembly 210 may include a support member 232 extending from a proximal end 240 adjacent back side 208 of device housing 203 to an opposite distal end 242. Electrical wiring, such as a portion of an electrical cable 234, may extend through a channel within support member 232 (see, e.g., FIGS. 5A-5C) and electrical cable 234 may protrude from distal end 242.

As shown in FIGS. 7A and 7B, media device 200 may be disposed on an external surface 252 with a portion of bottom side 214 of device housing 203, such as an edge portion 251 at or near a junction between bottom side 214 and back side 208, abutting and extending along external surface 252. Additionally, a portion of distal end 242 of support member 232 may abut external surface 252 to support display device 202 as shown. According to various embodiments, integrated assembly 210 may be adjusted to change the inclination angle of display device 202. For example, as described more fully below, a coupling member of integrated assembly 210 may be rotatably secured within a mounting socket of display device 202 to adjust between various positions in which support member 232 extends in different directions from back side 208 of device housing 203.

According to one embodiment, display surface 204 may be disposed in a landscape orientation and may be inclined at a first selected inclination, such as an inclination angle θ3 with respect to external surface 252 as shown in FIG. 7A. Additionally, integrated assembly 210 may be adjusted from the position shown in FIG. 7A so that support member 232 supports device housing 203 of display device 202 with display surface 204 inclined at another selected inclination, such as an inclination angle θ4 with respect to external surface 252, as illustrated in FIG. 7B. Accordingly, media device 200 may enable a user to readily adjust the inclination angle of display device 202 as desired to obtain a desired viewing angle for display surface 204 and/or field of view for a camera (see, e.g., camera 150 in FIG. 3) of display device 202. While two different orientations for support member 232 of integrated assembly 210 are illustrated in FIGS. 7A and 7B, support member 232 may be disposed in any suitable position within a selected positional range provided via rotational positioning of integrated assembly 210. Additionally, while FIGS. 7A and 7B illustrate display device 202 in a landscape orientation, display device 202 may also be adjustably supported by integrated assembly 210 in a portrait orientation (see, e.g., FIG. 4B) in the same or similar manner.

Figure 8A:
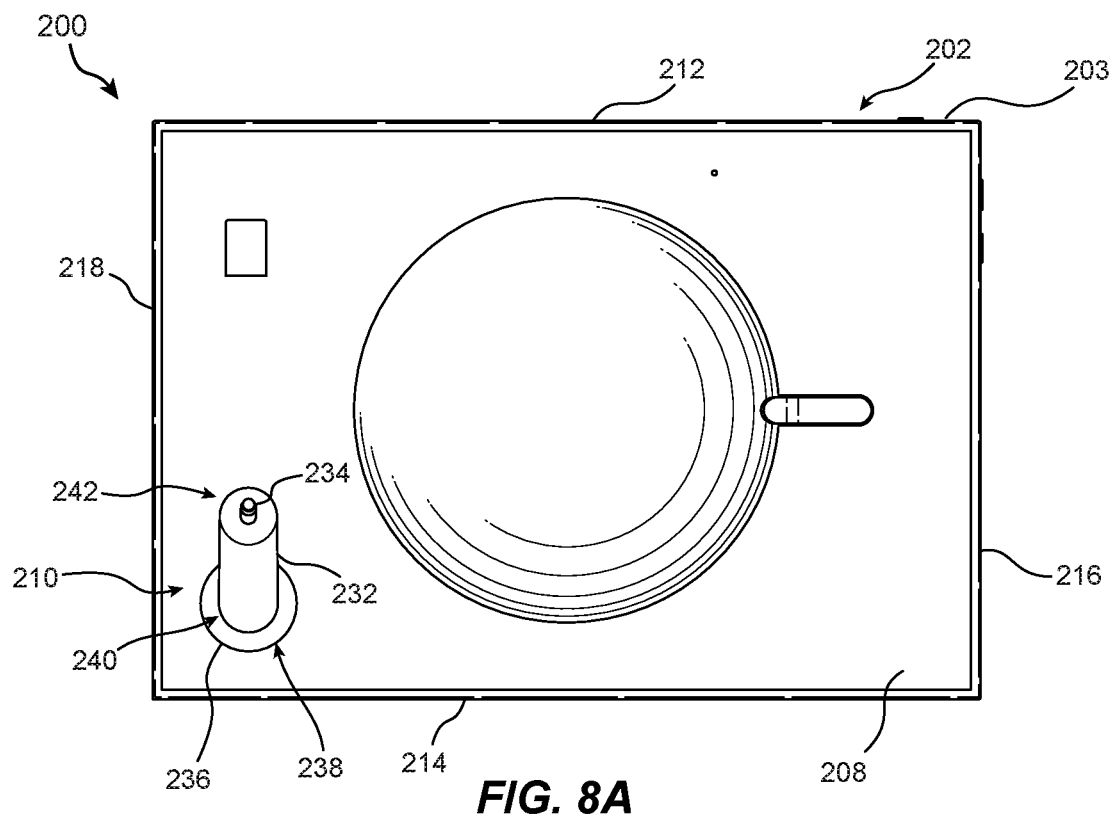
FIG. 8A is a rear view of an exemplary media device illustrating an assembly including a power cable with an integrated stand disposed in a selected orientation according to some embodiments.
Figure 8B:
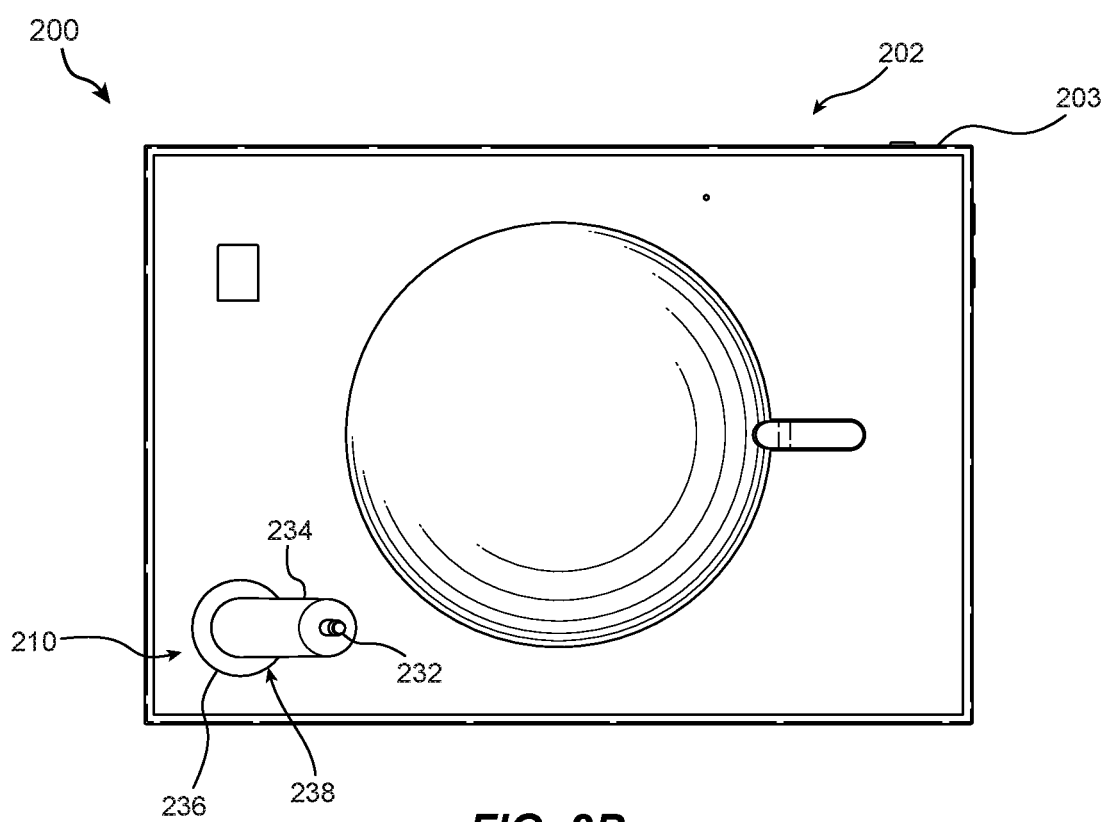
FIG. 8B is a rear view of the media device of FIG. 8A illustrating the assembly disposed in another selected orientation according to some embodiments.

FIGS. 8A and 8B show rear views of media device 200, with integrated assembly 210 adjusted such that support member 232 extends in the exemplary directions respectively illustrated in FIGS. 7A and 7B. For example, FIG. 8A, shows support member 232 oriented as shown in FIG. 7A, with a coupling member 236 rotatably mounted in mounting socket 238. As shown in FIG. 8B, coupling member 236 may be rotated within mounting socket 238 in a clockwise direction (relative to FIG. 8A) so that support member 232 is rotated and oriented in a direction corresponding to that shown in FIG. 7B.

FIGS. 9A-9C show partial cross-sectional views of a portion of integrated assembly 210 rotatably mounted to device housing 203 of display device 202, in accordance with various embodiments. As shown in these figures, coupling member 236 of integrated assembly 210 may be disposed at proximal end 240 of support member 232. Coupling member 236 may be secured within mounting socket 238 of device housing 203 so that coupling member 236 is rotatable in mounting socket 238 about a rotational axis 290. An electrical connector 254 may be centered within coupling member 236 and may extend along rotational axis 290. Electrical connector 254 may be disposed within, for example, a complementary connector socket and may surround an electrical terminal, such as a pin terminal (see, e.g., connector socket 176 and electrical terminal 178 shown in FIG. 6). Electrical connector 254 may have any suitable shape that allows for rotation of electrical connector 254 within the corresponding connector socket and around the electrical terminal. For example, electrical connector 254 may have a cylindrical or substantially cylindrical and/or frusto-conical shape, and/or any other suitable shape having a circular cross-sectional periphery centered about rotational axis 290. Accordingly, electrical connector 254 may maintain an electrical connection with the electrical terminal when coupling member 236 is rotated within mounting socket 238.

In at least one embodiment, coupling member 236 may be fastened within mounting socket 238 via, for example, one or more fastening protrusions, such as fastening protrusion 284 extending from a peripheral surface 292 of coupling member 236. In some examples, mounting socket 238 may be surrounded and defined by a rotational element, such as rotational collar 280 shown in FIGS. 9A-9C. Rotational collar 280 may have, for example, a cylindrical and/or ring shape, and/or any other suitable shape suitable for rotating relative to another portion of device housing 203 of display device 202. Rotational collar 280 may surround peripheral surface 292 of coupling member 236 and may be fastened or otherwise secured to coupling member 236 via fastening protrusion 284, which may be disposed in a corresponding fastening recess 282 defined in rotational collar 280. Accordingly, rotational collar 280 may rotate in conjunction with rotation of coupling member 236 about rotational axis 290. As further illustrated, rotational collar 280 may be peripherally surrounded by an inner surface 288 of device housing 203. Inner surface 288 may have a cylindrical or substantially cylindrical shape corresponding to an outer surface of rotational collar 280.

In some embodiments, as shown, one or more frictional elements, such as frictional elements 286, may be disposed between rotational collar 280 and inner surface 288 of device housing 203 to allow for rotation of rotational collar 280 with respect to inner surface 288 when an external force is applied by a user, while providing sufficient frictional force to hold rotational collar 280 and coupling member 236 in a selected orientation as support member 232 supports display device 202 during use. Frictional elements 286 may be any suitable frictional elements, such as O-rings that include a resilient material (e.g., an elastomer). As shown in FIGS. 9B, and 9C, coupling member 236 may be rotated in conjunction with rotational collar 280 by applying sufficient torque to coupling member 236 (e.g., via support member 232). Accordingly, coupling member 236 may be rotated within mounting socket 238 to orient support member 232 in a desired direction. In some embodiments, device housing 203 and/or coupling member 236 may include stops to limit rotation of coupling member 236 to a specified range of orientations suitable for supporting display device 202. Coupling member 236 may be readily removed by applying a pulling force to disengage fastening protrusion 284 on coupling member 236 from fastening recess 282 defined in rotational collar 280, thereby allowing for ready removal of integrated assembly 210 from device housing 203 by a user.

Figure 10:
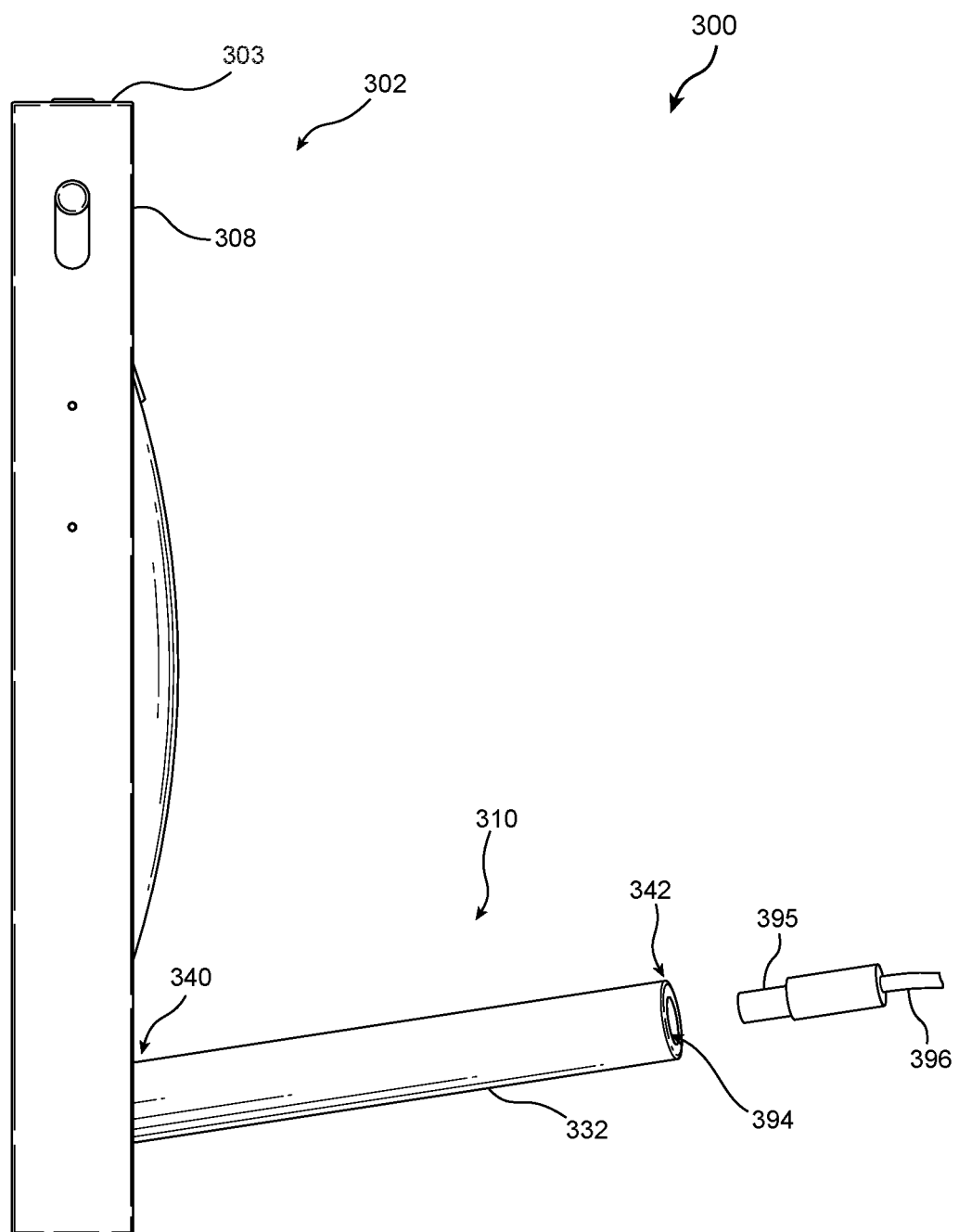
FIG. 10 is a top view of an exemplary media device according to some embodiments of this disclosure.

FIG. 10 illustrates an exemplary media device 300 having an integrated assembly 310 with a distal end portion that is connectable to an external power source. As shown in this figure, media device 300 may include a display device 302 that is coupled to integrated assembly 310 at a back side 308 of device housing 303. Integrated assembly 310 may include a support member 332 extending from a proximal end 340 adjacent back side 308 to an opposite distal end 342. Integrated assembly 310 may be secured to device housing 303 and, in some embodiments, may be removably coupled to device housing 303 as described above, for example, in reference to FIGS. 5A-9C. Support member 332 of integrated assembly 310 may be fixed in a selected orientation or may be rotatable with respect to device housing 303 of display device 302 to allow for user adjustment.

In some embodiments, as shown in FIG. 10, integrated assembly 310 may include a connector socket 394 defined in distal end 342 of support member 332. Electrical wiring, such as an electrical cable (see, e.g., electrical cable 134 in FIGS. 5A-5C), may extend through a channel defined within support member 332 from connector socket 394 to provide power from connector socket 394 to electronic components of display device 302 disposed within device housing 303. Connector socket 394 may be configured to electrically couple with an external power supply source. For example, connector socket 394 may be dimensioned to receive and electrically couple with a connector plug 395 of a power cable 396. Connector plug 395 may be removably coupled to connector socket 394 to enable a user to readily connect connector plug 395 during use of display device 302 and disconnect connector plug 395 for purposes of storage and/or transportation of media device 300. Power cable 396 may extend from connector plug 395 to an outlet plug (not shown) at an opposite end of power cable 396. The outlet plug may be configured to be electrically coupled to an electrical outlet to provide power to electronic components of display device 302.

Figure 11A:
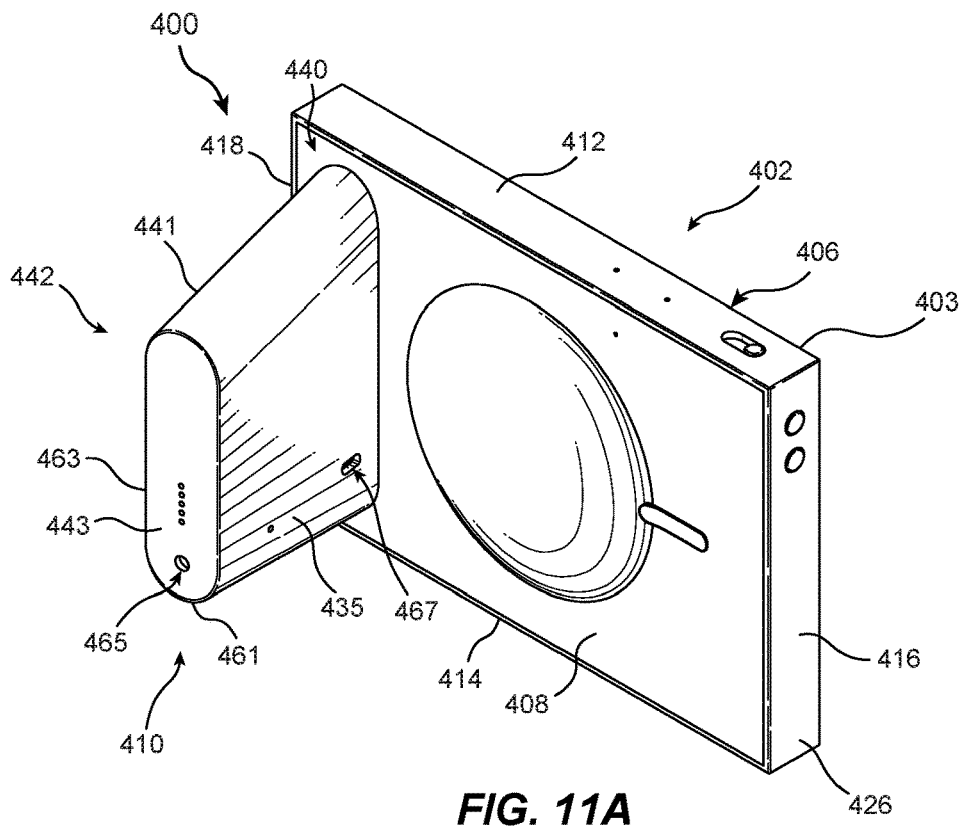
FIG. 11A is a perspective view illustrating an exemplary media device according to some embodiments.
Figure 11B:
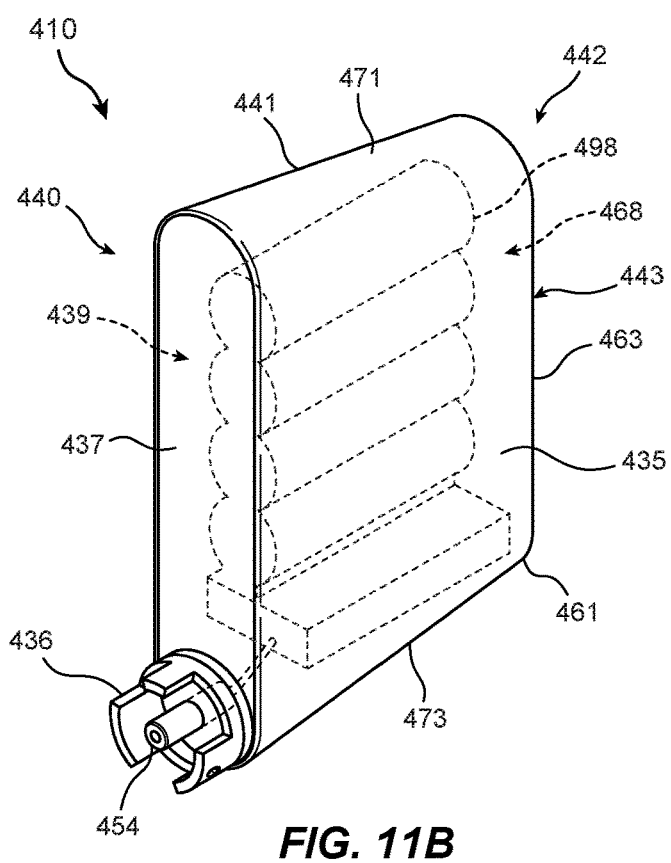
FIG. 11B is a perspective view illustrating an exemplary integrated positioning and power supply assembly according to some embodiments.

FIG. 11A illustrates an exemplary interactive media device 400 and FIG. 11B illustrates an exemplary integrated assembly 410 that includes an integral power source for supplying power to a connected display device 402. As shown in FIG. 11A, display device 402 may have a device housing 403 that includes a front side 406, a back side 408, a top side 412, a bottom side 414, a left side 416, and a right side 418. Front side 406 may frame a display surface (see display surface 404 in FIGS. 12A and 12B; see also display surface 104 in FIGS. 1, 3, 4A, and 4B). In some examples, display device 402 may also include a camera (see, e.g., camera 150 in FIG. 3) disposed at or near a corner of front side 406 (e.g., near an intersection of left side 416 and top side 412).

According to various embodiments, media device 400 may include an integrated assembly 410 that is coupled to device housing 403 to provide mechanical support and electrical power to display device 402. Integrated assembly 410 may, for example, be secured to device housing 403 at back side 408 (e.g., via coupling member 436 shown in FIG. 11B). In various examples, integrated assembly 410 may include a support member or support housing 441 that encloses a battery power supply 498 for storing and delivering power. Support housing 441 may include a rigid material, such as a rigid polymer, metal, and/or composite, that supports display device 402 in various orientations on an external surface and that protects components enclosed therein. In some examples, at least a portion of support housing 441, such as regions positioned to abut an external supporting surface, may also include a material that provides a suitable degree of stiction on a variety of surface types to prevent sliding of display device 402 during use. For example, support housing 441 may include an elastomeric layer (e.g., a polyurethane polymer, such as thermoplastic polyurethane, TPU, and/or any other suitable elastomer) that covers and/or surrounds at least a portion of the rigid material and is positioned to abut the external surface.

As shown in FIG. 11A, a proximal end 440 of support housing 441 may be positioned adjacent to back side 408 of device housing 403. Support housing 441 may include a side surface 435 extending from proximal end 440 to a distal surface 443 at distal end 442. Support housing 441 may have any suitable shape and size. In various examples, support housing 441 may be dimensioned to not overlap a central portion of the back side 408 when mounted to device housing 403, thereby minimizing the external profile of the display system and preventing interference with certain components on back side 408 (e.g., speaker cover 146, microphone opening 128, and/or port cover 148 shown in FIG. 2). In some examples, side surface 435 may be angled with respect to outer surface portions of device housing 403 of display device 402. For example, proceeding in a direction from proximal end 440 toward distal end 442, side surface 435 may be angled inward from peripheral side portions of device housing 403, such as right side 418 and/or bottom side 414. In various examples, at least a portion of side surface 435 may taper from proximal end 440 toward distal end 442. For example, a distance between a top region 471 and a bottom region 473 of side surface 435 may taper from a wider section at proximal end 440 to a narrower section at distal end 442. In at least one example, top region 471 and/or bottom region 473 may have a rounded surface shape or any other suitable shape. Portions of side surface 435 extending between top region 471 and bottom region 473 may have any suitable surface shape, and in some examples, may be planar or substantially planar as shown in FIGS. 11A and 11B. Portions of support housing 441 at distal end 442, such as edge portions 461 and 463 located at intersections between side surface 435 and distal surface 443, may be configured to contact an external surface when device housing 403 of display device 402 is supported on the external surface in selected orientations (see, e.g., FIGS. 12A and 12B).

As shown in FIG. 11B, integrated assembly 410 may be separated from device housing 403 of display device 402. As shown, integrated assembly 410 may include a coupling member 436 extending from a mounting surface 437 at proximal end 440. Mounting surface 437 may be planar or substantially planar, or any other suitable surface shape, and may be dimensioned to abut a complementary surface portion of back side 408 of device housing 403. Coupling member 436 may be disposed on any suitable location at proximal end 440. In some examples, coupling member 436 may be located at or near bottom region 473 of support housing 441 such that coupling member 436 is positioned to be removably coupled within a mounting socket (e.g., a mounting socket 138) that is configured to alternatively be utilized with integrated assembly 110 (see, e.g., FIGS. 2, 5A, and 6). In at least one example, coupling member 436 may be securely coupled to a mounting socket at a portion of display device 402 that is generally opposite a position of a camera (see, e.g., camera 150 in FIG. 1) in each of the X-, Y-, and Z-directions (see, e.g., FIG. 1). For example, coupling member 436 may be positioned at back side 408 nearest an intersection of bottom side 414 and right side 418. Coupling member 436 may be dimensioned and configured to securely couple integrated assembly 410 to device housing 403 with integrated assembly 410 held in a predetermined position and orientation as shown in FIG. 11A.

In various embodiments, integrated assembly 410 may include a power-delivery mechanism 439 that includes a power supply, such as a battery power supply 498 as illustrated in FIG. 11B. Battery power supply 498 may be disposed within an interior cavity 468 defined within support housing 441. In at least one example, battery power supply 498 may include one or more connected battery cells and a circuit, which may include a printed circuit board, for controlling delivery of electrical power to and from the battery cells. Battery power supply 498 may be electrically coupled to electronic components of display device 402 disposed within device housing 403 via an electrical path extending through coupling member 436. In at least one example, battery power supply 498 may be electrically coupled to an electrical connector 454 of coupling member 436 via, for example, an electrical cable or other suitable electrical connection. Battery power supply 498 may supply power to electrical components of display device 402 when coupling member 436 is mounted to device housing 403 with electrical connector 454 electrically coupled to an electrical terminal of display device 402 (see, e.g., FIGS. 5A-6 and 9A-9C). Thus, as will be described in greater detail below, integrated assembly 410 may support display device 402 in a selected orientation on an external surface while also supplying power for operating the display when not connected to an external power source.

In some embodiments, battery power supply 498 may be rechargeable. For example, integrated assembly 410 may include a connector socket 465 that enables connection to an external power source (e.g., an electrical outlet) via a connected power cable (see, e.g., power cable 396 in FIG. 10). In such an example, integrated assembly 410 may be connected, via the power cable, to the external power source to enable operation of electronic components of display device 402 and charging of battery power supply 498, both of which may occur simultaneously in some embodiments. Thus, a user may operate display device 402 using either power supplied by the power cable from an external source or using power supplied from battery power supply 498, allowing for increased portability and use of the display system in a various environments and situations. In certain embodiments, battery power supply 498 may additionally or alternatively be charged via electrical connector 454. For example, integrated assembly 410 may be detached from the display device and electrical connector 454 may be connected to an external power source for charging via, for example, a charging device having a connection socket configured to receive electrical connector 454. In at least one example, battery power supply 498 may also include an accessory port 467, which may be dimensioned and configured to receive any suitable accessory connector (e.g., a USB-C connector, etc.) for communicatively coupling integrated assembly 410 and/or display device 402 to an external accessory device and/or power source. Data (e.g., image date, audio data, etc.) and/or power may be received and/or transmitted via accessory port 467. In some embodiments, data may be also transmitted from integrated assembly 410 to display device 402 via a wired connection provided, for example, through coupling member 436 and/or via a suitable wireless connection.

Figure 12A:
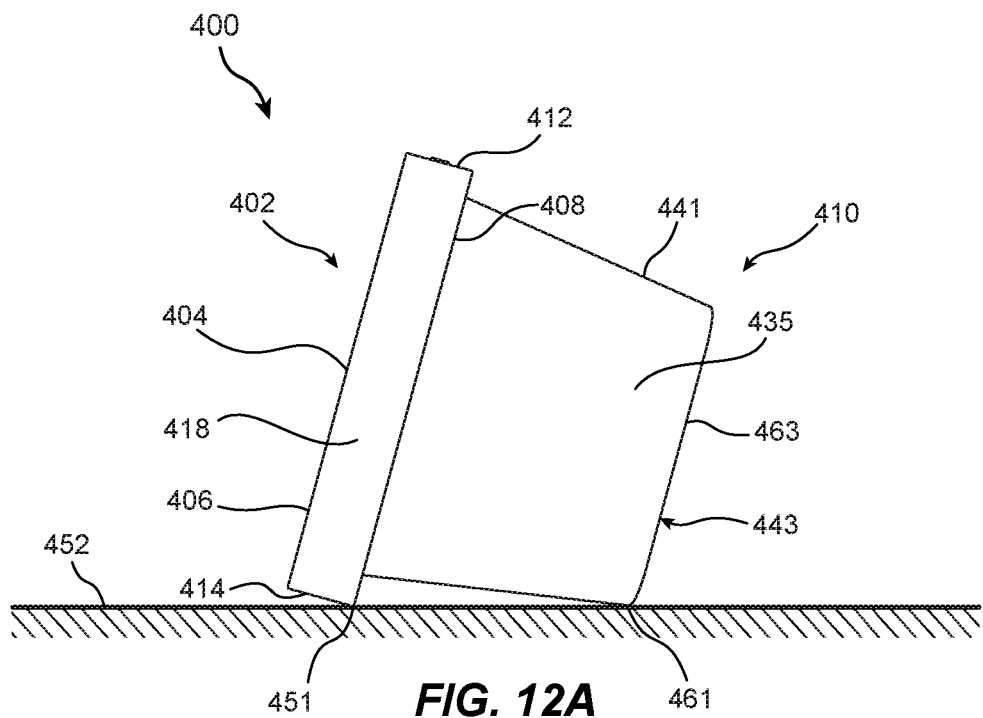
FIG. 12A is a side view illustrating an exemplary media device supported on an external surface in a selected orientation according to some embodiments.
Figure 12B:
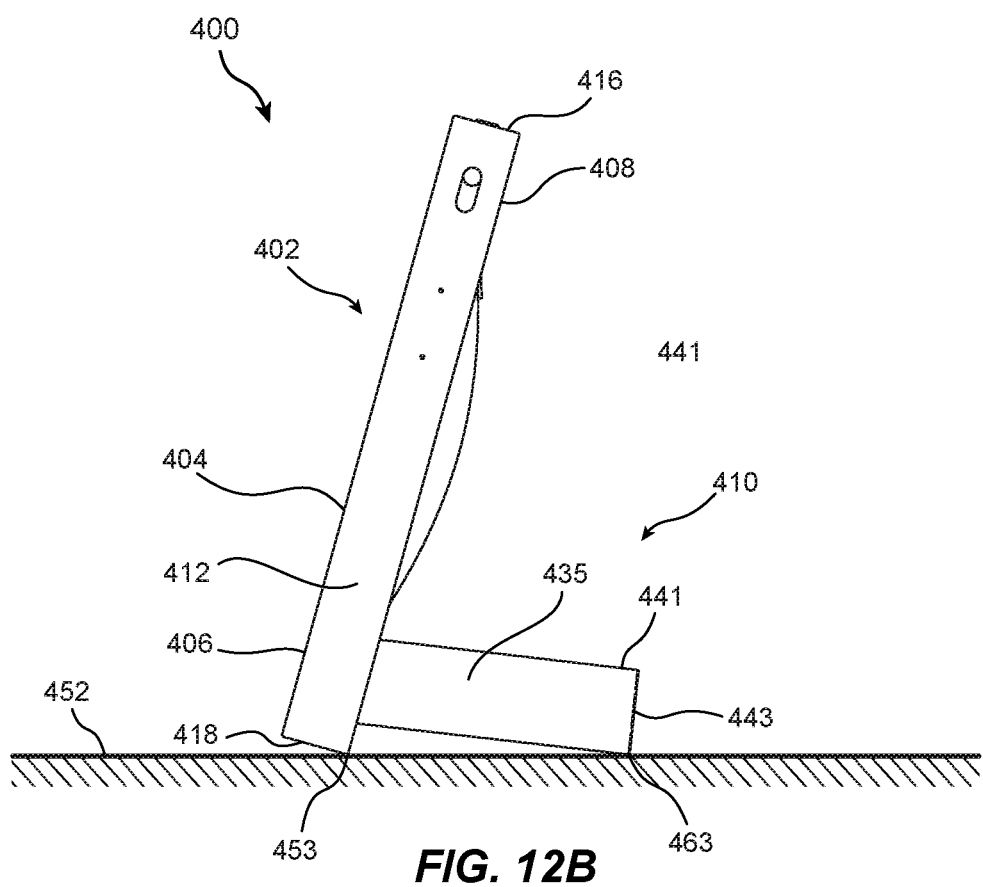
FIG. 12B is a side view illustrating the media device of FIG. 4A supported on the external surface in another selected orientation according to some embodiments.

FIGS. 12A and 12B show the media device 400 illustrated in FIG. 11A with display device 402 disposed in a landscape orientation and a portrait orientation, respectively. In some embodiments, support housing 441 may be dimensioned to support display device 402 in various orientations. For example, side surface 435 of support housing 441 may be dimensioned and oriented to incline display surface 404 of display device 402 at a suitable inclination angle, such as an angle of between approximately 60° and approximately 85° with respect to an external surface 452 when display surface 404 is in each of the landscape and portrait orientations (see, e.g., FIGS. 4A and 4B). In some examples, the inclination angle, which may be the same or approximately the same in both the landscape and portrait orientations, may be an angle that is suitable for a user to view display surface 404 and/or that is suitable for a camera of display device 402 to capture images of an external environment.

As shown in FIG. 12A, display device 402 may be positioned in a landscape orientation with a portion of bottom side 414 of device housing 403, such as an edge portion 451 at or near a junction between bottom side 414 and back side 408, abutting and extending along external surface 452, which may be a planar or substantially planar horizontal surface. Additionally, an edge portion 461 of support housing 441 located at an intersection between distal surface 443 and bottom region 473 of side surface 435 may abut external surface 452 to support display device 402 in the illustrated landscape position.

As shown in FIG. 12B, display device 402 may be positioned in a portrait orientation with a portion of right side 418 of device housing 403, such as an edge portion 453 at or near a junction between right side 418 and back side 408, abutting and extending along external surface 452. Additionally, an edge portion 463 of support housing 441 located at an intersection between distal surface 443 and side surface 435 may abut external surface 452 to support display device 402 in the illustrated portrait position. In at least one example, edge portion 463 of support housing 441 may extend substantially parallel to edge portion 453 of device housing 403 of display device 402 so that that edge portion 463 and edge portion 453 both substantially abut and/or contact external surface 452.

Figure 13:
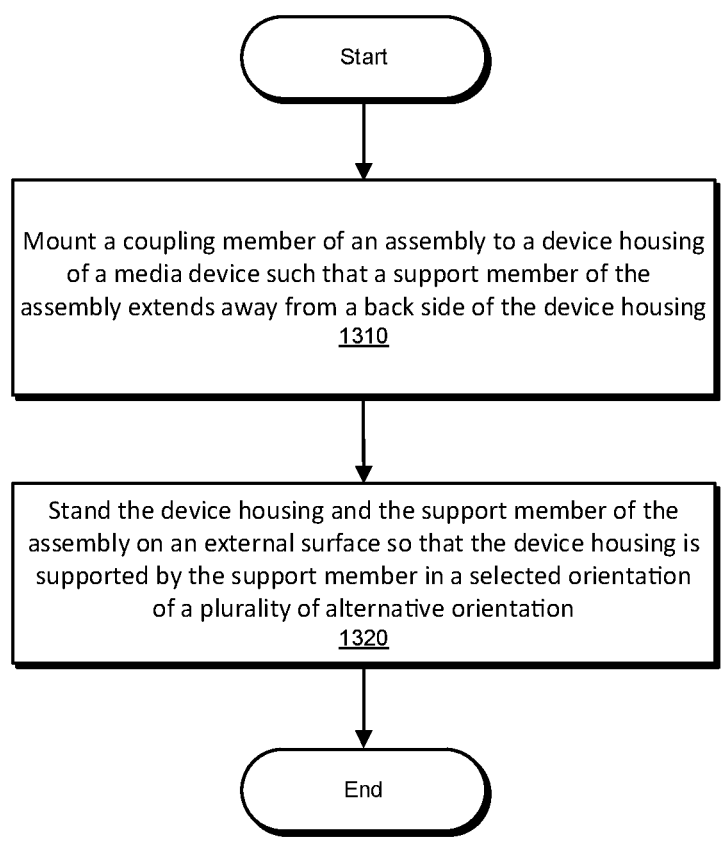
FIG. 13 is a flow diagram of an exemplary method for coupling and positioning an integrated assembly and a media device according to some embodiments.

FIG. 13 is a flow diagram of an exemplary method 1300 for coupling and positioning an integrated assembly and a media device. As illustrated in FIG. 13, at step 1310, a coupling member of an assembly may be mounted to a device housing of a media device such that a support member of the assembly extends away from a back side of the device housing. The support member may extend between a proximal end adjacent the coupling member and a distal end of the support member. For example, coupling member 136 of integrated assembly 110 may be mounted to device housing 103 of display device 102 such that elongated support member 132 of integrated assembly 110 extends from back side 108 of device housing 103 between a proximal end 140 and a distal end 142 (see, e.g., FIGS. 1-3; see also FIGS. 7A-12B).

In some examples, the coupling member of the assembly may be mounted to the device housing of the media device such that an electrical connector of the coupling member is electrically coupled to an electrical terminal in the device housing to supply power from a power-delivery mechanism disposed within the support member to an electronic circuit within the device housing via the electrical connector. For example, when coupling member 136 is mounted to device housing 103, electrical connector 154 of coupling member 136 may be electrically coupled to electrical terminal 178 in device housing 103 to supply power from a power-delivery mechanism 139 disposed within support member 132 to electronic components within the device housing 103 via electrical connector 154.

At step 1320, the device housing and the support member of the assembly may be stood on an external surface so that the device housing is supported by the support member in a selected orientation of a plurality of alternative orientations. For example, device housing 103 and support member 132 may be stood on external surface 152 so that device housing 103 is supported by support member 132 in a selected portrait or landscape orientation (see, e.g., FIGS. 4A and 4B; see also FIGS. 7A, 7B, 12A, and 12B).

In some embodiments, a display surface of the media device may be inclined at an inclination angle of between approximately 60° and approximately 85° with respect to the external surface when the device housing is supported by the support member in the selected orientation. For example, display surface 104 may be inclined at an inclination angle of between approximately 60° and approximately 85° with respect to external surface 152 when device housing 103 is supported by support member 132 in the selected orientation (see, e.g., FIGS. 4A and 4B; see also FIGS. 7A, 7B, 12A, and 12B).

According to various embodiments, mounting the coupling member of the assembly to the device housing may further include rotatably securing the coupling member within a mounting socket at the back side of the device housing. In this example, the method may further include rotating the coupling member within a mounting socket at the back side of the display device. For example, coupling member 136 may be rotatably secured within mounting socket 138 at back side 108 of device housing 103, and coupling member 136 may be rotated within mounting socket 138 (see, e.g., FIGS. 7A-9C).

In at least one embodiment, standing the device housing and the support member on the external surface may further include positioning the display surface in one of a landscape orientation and a portrait orientation during which a first peripheral side portion of the device housing abuts and extends along the external surface. In this example, the method may further include positioning the display surface in the other of the landscape orientation and the portrait orientation during which a second peripheral side portion of the device housing abuts and extends along the external surface. For example, display surface 104 may positioned in a landscape orientation during which a first peripheral side portion, such as edge portion 151 of bottom side 114 of device housing 103, abuts external surface 152. Display surface 104 may then be positioned in a portrait orientation during which a second peripheral side portion, such as edge portion 153 of right side 118 of device housing 103, abuts external surface 152 (see, e.g., FIGS. 4A and 4B; see also FIGS. 7A, 7B, 12A, and 12B).

Figure 14:
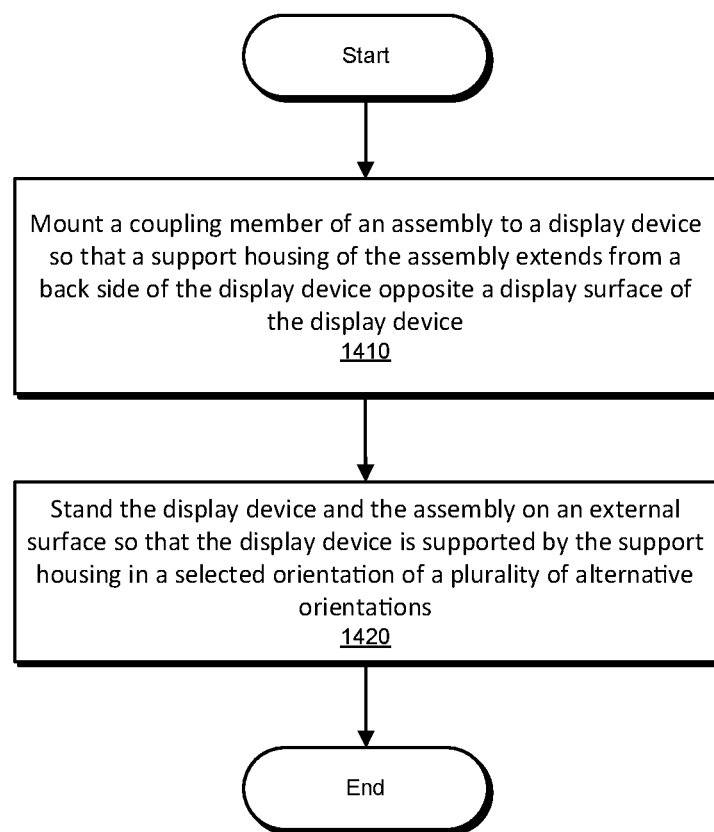
FIG. 14 is a flow diagram of an exemplary method for coupling and positioning an integrated assembly and a media device according to some embodiments.

FIG. 14 is a flow diagram of an exemplary method 1400 for coupling and positioning an integrated assembly and a display device. As illustrated in FIG. 14, at step 1410, a coupling member of an assembly may be mounted to a display device so that a support housing of the assembly extends from a back side of the display device opposite a display surface of the display device. For example, coupling member 436 of integrated assembly 410 may be mounted to display device 402, which may be a display device, so that support housing 441 of integrated assembly 410 extends from back side 408 of display device 402 opposite display surface 404 of display device 402 (see, e.g., FIGS. 11A-12B).

In some examples, the assembly may include (i) an electrical connector of the coupling member that is electrically coupled to a terminal of the display device when the coupling member is mounted to the display device, (ii) a battery power supply for supplying power to the display device disposed within the support housing and electrically coupled to the electrical connector, and (iii) a side surface of the support housing tapering from a mounting surface of the support housing configured to abut a back side of the display device toward a distal end of the support housing. For example, integrated assembly 410 may include an electrical connector 454 of coupling member 436 that is electrically coupled to a terminal of display device 402 when coupling member 436 is mounted to display device 402. Integrated assembly 410 may also include battery power supply 498 for supplying power to display device 402 disposed within support housing 441 and electrically coupled to electrical connector. Additionally, integrated assembly 410 may include a side surface 435 of support housing 441 that tapers from mounting surface 437 of support housing 441, which is configured to abut back side 408 of display device 402, toward distal end 442 of support housing 441 (see, e.g., FIGS. 11A-12B).

At step 1420, the display device and the assembly may be stood on an external surface so that the display device is supported by the support housing in a selected orientation of a plurality of alternative orientations. For example, display device 402 and integrated assembly 410 may be stood on external surface 452 so that display device 402 is supported by support housing 441 in a selected portrait or landscape orientation (see, e.g., FIGS. 12A and 12B).

EXAMPLE EMBODIMENTS

Example 1

A media device including (i) a device housing surrounding electronic components of the media device, (ii) a support member for supporting the device housing in each of a plurality of alternative orientations on an external surface, the support member extending away from a back side of the device housing between a proximal end and a distal end of the support member, (iii) a coupling member disposed at the proximal end of the support member and secured to the device housing at the back side, and (iv) a power-delivery mechanism disposed within the support member and electrically coupled to the electronic components via an electrical path through the coupling member.

Example 2

The media device of example 1, wherein the support member includes a rigid material surrounding an interior of the support member.

Example 3

The media device of example 2, wherein the support member includes an elastomeric material surrounding at least a portion of the rigid material.

Example 4

The media device of any of examples 1-3, further including a display device having a display surface at a front side of the device housing, wherein the support member is dimensioned and oriented to incline the display surface at an inclination angle of between approximately 60° and approximately 85° with respect to the external surface when the device housing is supported by the support member on the external surface in each of the plurality of alternative orientations.

Example 5

The media device of example 4, wherein the support member is dimensioned and oriented so that a portion of the distal end of the support member and a peripheral region of the device housing abut the external surface when the device housing is supported by the support member on the external surface in each of the plurality of alternative orientations.

Example 6

The media device of example 5, wherein (i) the device housing is positionable with the display surface in a landscape orientation when a first peripheral side portion of the device housing abuts and extends along the external surface, and (ii) the display device is positionable with the display surface in a portrait orientation when a second peripheral side portion of the display device abuts and extends along the external surface.

Example 7

The media device of example 6, wherein the support member is dimensioned and oriented to (i) incline the display surface at a first inclination angle with respect to the external surface when the display surface is positioned in the landscape orientation, and (ii) incline the display surface at a second inclination angle with respect to the external surface when the display surface is positioned in the portrait orientation Example 8

The media device of example 7, wherein the first inclination angle is approximately equal to the second inclination angle.

Example 9

The media device of any of examples 6-8, wherein each of the first and second peripheral side portions of the device housing includes an elastomeric material that abuts the external surface when the display surface is in the respective landscape and portrait orientations.

Example 10

The media device of any of examples 1-9, wherein the support member is elongated along a support member axis oriented at an oblique angle with respect to the back side of the device housing.

Example 11

The media device of any of examples 1-10, wherein (i) the coupling member is rotatably secured within a mounting socket at the back side of the device housing, and (ii) an orientation of the support member is adjustable by rotating the coupling member within the mounting socket.

Example 12

The media device of example 11, wherein the display device further includes (i) a rotational collar in the device housing surrounding an electrical terminal in the mounting socket, and (ii) a fixed surface coupled to the device housing and surrounding the rotational collar, wherein the coupling member is fastened to the rotational collar so that the rotational collar is rotatable with respect to the fixed surface in conjunction with the rotation of the coupling member within the mounting socket.

Example 13

The media device of any of examples 1-12, wherein (i) the coupling member is disposed nearest an intersection of a first peripheral side and a second peripheral side of four peripheral sides of the device housing, and (ii) the media device further includes a camera device nearest an intersection of a third peripheral side and a fourth peripheral side of the four peripheral sides.

Example 14

The media device of any of examples 1-13, wherein the coupling member is removably secured to the device housing and includes an electrical connector removably coupled to an electrical terminal in the device housing to supply power from the power-delivery mechanism to the electronic components within the device housing.

Example 15

The media device of example 14, wherein the power-delivery mechanism includes an electrical cable extending through an inner channel defined within the support member, the electrical cable extending from the electrical connector and protruding from the distal end of the support member.

Example 16

The media device of any of examples 1-14, wherein the power-delivery mechanism includes a connector socket located at the distal end of the support member and dimensioned to receive a connector plug of a power cable.

Example 17

An assembly for a media device, the assembly including (i) an elongated support member for supporting a device housing of the media device in each of a plurality of alternative orientations on an external surface, the support member defining an inner channel extending longitudinally between a proximal end and a distal end of the support member, (ii) a coupling member disposed at the proximal end of the support member, the coupling member including an electrical connector and peripheral mounting features surrounding the electrical connector and dimensioned to removably secure the coupling member to the device housing such that the electrical connector is electrically coupled to an electrical terminal in the device housing and the support member extends away from a back side of the device housing, and (iii) a power-delivery mechanism disposed within the support member for supplying power to electronic components within the device housing via the electrical connector.

Example 18

The assembly of example 17, wherein the electrical connector extends along a connector axis and the support member extends along a support member axis oriented at an oblique angle with respect to the connector axis.

Example 19

A method including (i) mounting a coupling member of an assembly to a device housing of a media device such that (a) a support member of the assembly extends away from a back side of the device housing between a proximal end adjacent the coupling member and a distal end of the support member, and (b) an electrical connector of the coupling member is electrically coupled to an electrical terminal in the device housing to supply power from a power-delivery mechanism disposed within the support member to an electronic circuit within the device housing via the electrical connector, and (ii) standing the device housing and the support member of the assembly on an external surface so that the device housing is supported by the support member in a selected orientation of a plurality of alternative orientations.

Example 20

The method of example 19, wherein (i) standing the device housing and the support member of the assembly on the external surface further includes positioning a display surface at a front side of the device housing in one of a landscape orientation and a portrait orientation during which a first peripheral side portion of the device housing abuts and extends along the external surface, and (ii) the method further includes positioning the display surface in the other of the landscape orientation and the portrait orientation during which a second peripheral side portion of the device housing abuts and extends along the external surface.

Example 21

A media device including (i) a display device having a front side including a display surface, (ii) a support housing for supporting the display device in each of a plurality of alternative orientations on an external surface, the support housing extending from a back side of the display device between a mounting surface of the support housing abutting the back side of the display device and a distal end of the support housing, (iii) a coupling member disposed at the mounting surface of the support housing and mounted to the display device, and (iv) a battery power supply disposed within the support housing and electrically coupled to the display device via an electrical path extending through the coupling member.

Example 22

The media device of example 21, wherein the support housing includes a rigid material and an elastomeric material that covers at least a portion of the rigid material and is positioned to abut the external surface.

Example 23

The media device of example 21 or of example 22, wherein (i) the support housing further includes a side surface extending between the mounting surface and the distal end, and (ii) the side surface is dimensioned and oriented to incline the display surface of the display device at an inclination angle of between approximately 60° and approximately 85° with respect to the external surface when the display device is supported by the support housing on the external surface in each of the plurality of alternative orientations.

Example 24

The media device of example 23, wherein the side surface is dimensioned and oriented so that a portion of the distal end of the support housing and a peripheral region of the display device abut the external surface when the display device is supported by the support housing on the external surface.

Example 25

The media device of example 24, wherein (i) the display device is positionable with the display surface in a landscape orientation when a first peripheral side portion of the display device abuts and extends along the external surface, and (ii) the display device is positionable with the display surface in a portrait orientation when a second peripheral side portion of the display device abuts and extends along the external surface.

Example 26

The media device of example 25, wherein the support housing is oriented to (i) incline the display surface at a first inclination angle with respect to the external surface when the display surface is positioned in the landscape orientation, (ii) incline the display surface at a second inclination angle with respect to the external surface when the display surface is positioned in the portrait orientation, and (iii) the first inclination angle is approximately equal to the second inclination angle.

Example 27

The media device of example 25 or example 26, wherein the first and second peripheral side portions of the display device each include an elastomeric material that abuts the external surface when the display surface is in the landscape and portrait orientations.

Example 28

The media device of any of examples 25-27, wherein the side surface of the support housing includes an edge portion at the distal end that extends substantially parallel to an edge portion of the second peripheral side portion of the display device.

Example 29

The media device of any of examples 25-28, wherein, proceeding from the mounting surface toward the distal end, the side surface of the support housing is angled inward from the first peripheral side portion and the second peripheral side portion of the display device.

Example 30

The media device of any of examples 23-29, wherein the side surface of the support housing tapers from the mounting surface toward the distal end.

Example 31

The media device of any of examples 21-30, wherein (i) the coupling member is disposed nearest an intersection of a first peripheral side and a second peripheral side of four peripheral sides of the display device, and (ii) the display device includes a camera device disposed between the display surface and an intersection of a third peripheral side and a fourth peripheral side of the four peripheral sides.

Example 32

The media device of any of examples 21-31, wherein the coupling member secures the support housing in a predetermined orientation relative to the display device.

Example 33

The media device of any of examples 21-32, wherein the support housing does not overlap a central portion of the back side of the display device.

Example 34

The media device of any of examples 21-33, wherein the coupling member is removably mounted to the display device and includes an electrical connector removably coupled to an electrical terminal of the display device.

Example 35

The media device of any of examples 21-34, further including a connector socket located at the distal end of the support housing, wherein the connector socket is dimensioned to receive a connector plug of a power cable.

Example 36

The media device of example 35, wherein the battery power supply is configured to provide power to the display device when an external power source is not electrically coupled to the connector socket via the power cable.

Example 37

The media device of example 35 or example 36, wherein the battery power supply is rechargeable using power supplied from an external power source electrically coupled to the connector socket via the power cable.

Example 38

An assembly for a display device, the assembly including (i) a support housing for supporting the display device in each of a plurality of alternative orientations on an external surface, the support housing tapering from a mounting surface of the support housing configured to abut a back side of the display device toward a distal end of the support housing, (ii) a coupling member disposed at the mounting surface of the support housing, the coupling member dimensioned to be mounted to the display device so that (a) an electrical connector of the coupling member is electrically coupled to an electrical terminal of the display device, and (b) the support housing is secured in a predetermined orientation relative to the display device, and (iii) a battery power supply for supplying power to the display device disposed within the support housing and electrically coupled to the electrical connector.

Example 39

The assembly of example 38, wherein (i) the support housing further includes a side surface extending between the mounting surface and the distal end and (ii) the side surface intersects the mounting surface at oblique angles.

Example 40

A method including (i) mounting a coupling member of an assembly to a display device so that a support housing of the assembly extends from a back side of the display device opposite a display surface of the display device, the assembly including (a) an electrical connector of the coupling member that is electrically coupled to a terminal of the display device when the coupling member is mounted to the display device, (b) a battery power supply for supplying power to the display device disposed within the support housing and electrically coupled to the electrical connector, and (c) a side surface of the support housing tapering from a mounting surface of the support housing configured to abut a back side of the display device toward a distal end of the support housing, and (ii) standing the display device and the assembly on an external surface so that the display device is supported by the support housing in a selected orientation of a plurality of alternative orientations.

Computing devices and systems described and/or illustrated herein, such as those included in the illustrated display devices, broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A media device comprising:
   a device housing surrounding electronic components of the media device;
   a support member for supporting the device housing in each of a plurality of alternative orientations on an external surface, the support member extending away from a back side of the device housing between a proximal end and a distal end of the support member;
   a coupling member comprising a circular extension comprising peripheral mounting extensions for interfacing with corresponding mounting recesses of a mounting socket at the back side of the device housing, the coupling member disposed at the proximal end of the support member and secured to the device housing at the back side, wherein:
  the coupling member is rotatably secured within the mounting socket;
  the coupling member is rotatable about an axis that extends away from the back side of the device housing; and
  the support member extends away from the coupling member and the back side of the device housing at an angle, wherein the support member is rigidly coupled to or integrally formed with the coupling member at a fixed orientation and oblique angle to the coupling member, such that an orientation of the support member is adjustable by rotating the support member and the coupling member as a unit within and relative to the mounting socket about the axis; and
a power-delivery mechanism disposed within the support member and electrically coupled to the electronic components via an electrical path centrally through the support member and centrally through the coupling member.

2. The media device of claim 1, wherein the support member comprises a rigid material surrounding an interior of the support member.

3. The media device of claim 2, wherein the support member further comprises an elastomeric material surrounding at least a portion of the rigid material.

4. The media device of claim 1, further comprising a display device having a display surface at a front side of the device housing, wherein the support member is dimensioned and oriented to incline the display surface at an inclination angle of between approximately 60° and approximately 85° with respect to the external surface when the device housing is supported by the support member on the external surface in each of the plurality of alternative orientations.

5. The media device of claim 4, wherein the support member is dimensioned and oriented so that a portion of the distal end of the support member and a peripheral region of the device housing abut the external surface when the device housing is supported by the support member on the external surface in each of the plurality of alternative orientations.

6. The media device of claim 5, wherein:
  the device housing is positionable with the display surface in a landscape orientation when a first peripheral side portion of the device housing abuts and extends along the external surface; and
  the device housing is positionable with the display surface in a portrait orientation when a second peripheral side portion of the device housing abuts and extends along the external surface.

7. The media device of claim 6, wherein the support member is dimensioned and oriented to:
  incline the display surface at a first inclination angle with respect to the external surface when the display surface is positioned in the landscape orientation; and
  incline the display surface at a second inclination angle with respect to the external surface when the display surface is positioned in the portrait orientation.

8. The media device of claim 6, wherein each of the first and second peripheral side portions of the device housing comprises an elastomeric material that abuts the external surface when the display surface is in the respective landscape and portrait orientations.

9. The media device of claim 1, wherein the support member is elongated along a support member axis oriented at the oblique angle with respect to the back side of the device housing.

10. The media device of claim 1, further comprising at least one frictional element disposed between the proximal end of the support member and the device housing to hold the support member in a selected orientation relative to the device housing.

11. The media device of claim 10, wherein the at least one frictional element comprises two O-rings surrounding the proximal end of the support member.

12. The media device of claim 1, further comprising:
  a rotational collar in the device housing surrounding an electrical terminal in the mounting socket; and
  a fixed surface coupled to the device housing and surrounding the rotational collar, wherein the coupling member is fastened to the rotational collar so that the rotational collar is rotatable with respect to the fixed surface in conjunction with the rotation of the coupling member within the mounting socket.

13. The media device of claim 1, wherein:
  the coupling member is disposed nearest an intersection of a first peripheral side and a second peripheral side of four peripheral sides of the device housing; and
  the media device further comprises a camera device nearest an intersection of a third peripheral side and a fourth peripheral side of the four peripheral sides.

14. The media device of claim 1, wherein the coupling member is removably secured to the device housing and comprises an electrical connector removably coupled to an electrical terminal in the device housing to supply power from the power-delivery mechanism to the electronic components within the device housing.

15. The media device of claim 14, wherein the power-delivery mechanism comprises an electrical cable extending through an inner channel defined within the support member, the electrical cable extending from the electrical connector and protruding from the distal end of the support member.

16. The media device of claim 1, wherein the power-delivery mechanism comprises a connector socket located at the distal end of the support member and dimensioned to receive a connector plug of a power cable.

17. An assembly for a media device, the assembly comprising:
  an elongated support member for supporting a device housing of the media device in at least a portrait orientation resting on a side surface of the device housing at a first inclination angle and a landscape orientation resting on a bottom surface of the device housing at a second inclination on an external surface, the elongated support member defining an inner channel extending longitudinally between a proximal end and a distal end of the elongated support member, wherein the distal end of the elongated support member is configured to be equidistant from the bottom surface and the side surface of the device housing such that the first inclination angle is approximately equal to the second inclination angle;
  a coupling member disposed at the proximal end of the elongated support member, wherein the elongated support member is rigidly coupled to or integrally formed with the coupling member at a fixed orientation and oblique angle to the coupling member, the coupling member comprising:
an electrical connector; and
peripheral mounting extensions surrounding the electrical connector and dimensioned to removably secure the coupling member to the device housing by insertion of the peripheral mounting extensions into corresponding mounting recesses in the device housing such that the electrical connector is electrically coupled to an electrical terminal in the device housing and the elongated support member extends away from a back side of the device housing at the oblique angle; and
a power-delivery mechanism disposed centrally within the elongated support member for supplying power to electronic components within the device housing via the electrical connector.

18. The assembly of claim 17, wherein:
the electrical connector extends along a connector axis; and
the elongated support member extends along a support member axis oriented at an oblique angle with respect to the connector axis.

19. A method comprising:
mounting a coupling member of an assembly to a device housing of a media device such that:
the coupling member comprises mounting extensions that are positioned along a circular path and that are rotatable relative to the device housing about an axis that extends away from and substantially perpendicular to a back side of the device housing, wherein the mounting extensions are positioned within corresponding mounting recesses in the device housing;
a support member of the assembly extends away from the back side of the device housing at an oblique angle to the axis such that rotation of the support member and coupling member as a unit about the axis changes an orientation of the support member relative to the back side of the device housing, the support member comprising a proximal end comprising the coupling member and a distal end opposite the proximal end, wherein the support member is rigidly coupled to or integrally formed with the coupling member at a fixed orientation and at the oblique angle to the coupling member; and
an electrical connector of the coupling member is electrically coupled to an electrical terminal in the device housing to supply power from a power-delivery mechanism disposed centrally within the support member to an electronic circuit within the device housing via the electrical connector; and
standing the device housing and the support member of the assembly on an external surface so that the device housing is supported by the support member in a selected orientation of a plurality of alternative orientations.

20. The method of claim 19, wherein:
standing the device housing and the support member of the assembly on the external surface further comprises positioning a display surface at a front side of the device housing in one of a landscape orientation and a portrait orientation during which a first peripheral side portion of the device housing abuts and extends along the external surface; and
the method further comprises positioning the display surface in the other of the landscape orientation and the portrait orientation during which a second peripheral side portion of the device housing abuts and extends along the external surface.

* * * * *